United States Patent
Yonezawa et al.

(10) Patent No.: US 10,108,090 B2
(45) Date of Patent: Oct. 23, 2018

(54) PHOTOSENSITIVE COMPOSITION, METHOD FOR PRODUCING CURED FILM, CURED FILM, TOUCH PANEL, TOUCH PANEL DISPLAY DEVICE, LIQUID CRYSTAL DISPLAY DEVICE, AND ORGANIC EL DISPLAY DEVICE

(71) Applicant: FUJIFILM CORPORATION, Minato-ku, Tokyo (JP)

(72) Inventors: Hiroyuki Yonezawa, Shizuoka (JP); Kyouhei Sakita, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 3 days.

(21) Appl. No.: 15/399,741

(22) Filed: Jan. 6, 2017

(65) Prior Publication Data

US 2017/0115564 A1    Apr. 27, 2017

Related U.S. Application Data

(63) Continuation of application No. PCT/JP2015/069508, filed on Jul. 7, 2015.

(30) Foreign Application Priority Data

Jul. 18, 2014    (JP) ................................ 2014-147511

(51) Int. Cl.
*G03F 7/027* (2006.01)
*G03F 7/031* (2006.01)
(Continued)

(52) U.S. Cl.
CPC ................ *G03F 7/031* (2013.01); *C08F 2/48* (2013.01); *C08F 222/1006* (2013.01);
(Continued)

(58) Field of Classification Search
CPC .......... G03F 7/004; G03F 7/031; G03F 7/168; G03F 7/2002; G03F 7/322; G03F 7/38;
(Continued)

(56) References Cited

U.S. PATENT DOCUMENTS

| 2013/0047878 A1* | 2/2013 | Matsumoto ............... B41C 1/05 |
| | | 101/395 |
| 2013/0078393 A1* | 3/2013 | De Keyzer ........... G03F 7/0007 |
| | | 428/1.1 |

FOREIGN PATENT DOCUMENTS

| JP | 2000-080169 A | 3/2000 |
| JP | 2009-223216 | 10/2009 |

(Continued)

OTHER PUBLICATIONS

Machine translation of JP 2013-068972 (no date).*

(Continued)

*Primary Examiner* — Amanda C. Walke
(74) *Attorney, Agent, or Firm* — Solaris Intellectual Property Group, PLLC

(57) ABSTRACT

An object is to provide a photosensitive composition capable of obtaining a cured film having excellent reliability even when being heated at a low temperature and patterning by photolithography.
A photosensitive composition of the present invention includes a polymerizable monomer having three or more (meth)acryloyl groups and one or more carboxy groups in a molecule as Component A, a polymerizable monomer having three or more (meth)acryloyl groups and not having a carboxy group in a molecule as Component B, a photopolymerization initiator as Component C, a solvent as Component D, a blocked isocyanate compound as Component N, and a polymerization inhibitor as Component K, in which a (Continued)

content of Component A is 10% to 50% by mass with respect to a total content of Component A and Component B.

14 Claims, 3 Drawing Sheets

(51) Int. Cl.
| | |
|---|---|
| *G03F 7/40* | (2006.01) |
| *G06F 3/041* | (2006.01) |
| *H01L 51/50* | (2006.01) |
| *H05B 33/22* | (2006.01) |
| *G03F 7/16* | (2006.01) |
| *G03F 7/20* | (2006.01) |
| *G03F 7/32* | (2006.01) |
| *G03F 7/38* | (2006.01) |
| *C08F 2/48* | (2006.01) |
| *C08F 222/10* | (2006.01) |
| *C08F 222/16* | (2006.01) |
| *C08F 222/38* | (2006.01) |
| *G03F 7/075* | (2006.01) |
| *G02F 1/1333* | (2006.01) |

(52) U.S. Cl.
CPC ........ *C08F 222/16* (2013.01); *C08F 222/385* (2013.01); *G03F 7/027* (2013.01); *G03F 7/0755* (2013.01); *G03F 7/162* (2013.01); *G03F 7/168* (2013.01); *G03F 7/2002* (2013.01); *G03F 7/322* (2013.01); *G03F 7/38* (2013.01); *G03F 7/40* (2013.01); *G06F 3/041* (2013.01); *G06F 3/0412* (2013.01); *H01L 51/50* (2013.01); *H05B 33/22* (2013.01); *G02F 1/133345* (2013.01); *G06F 2203/04103* (2013.01)

(58) Field of Classification Search
CPC . G03F 7/40; G03F 7/038; G03F 7/032; G03F 7/0007; G03F 7/0385; G03F 7/0387; H01L 27/14621; H01L 27/1462; H01L 27/0271; H01L 27/0274; G02F 1/3338; G02F 1/133308
USPC ................. 345/173, 87; 349/12; 438/27; 430/285.1, 322, 313
See application file for complete search history.

(56) References Cited

FOREIGN PATENT DOCUMENTS

| | | | |
|---|---|---|---|
| JP | 2010-243812 | A | 10/2010 |
| JP | 2011-145677 | A | 7/2011 |
| JP | 2012-198527 | A | 10/2012 |
| JP | 2013-054341 | A | 3/2013 |
| JP | 5201066 | B2 | 6/2013 |

OTHER PUBLICATIONS

Machine translation of JP 2009-223216 (no date).*
International Search Report issued in International Application No. PCT/JP2015/069508 dated Sep. 8, 2015.
Written Opinion of the ISA issued in International Application No. PCT/JP2015/069508 dated Sep. 8, 2015.
English language translation of the following: Office action dated Aug. 29, 2017 from the JPO in a Japanese patent application No. 2016-534381 corresponding to the instant patent application. This office action translation is submitted now in order to supplement the understanding of the reference which is being disclosed in the instant Information Disclosure Statement.
Shin-Nakamura Chemical Co., Ltd., Product list, retrieved from URL, http://www.shin-nakamura.com/products/monomer-oligomer-03.html.

* cited by examiner

PHOTOSENSITIVE COMPOSITION, METHOD FOR PRODUCING CURED FILM, CURED FILM, TOUCH PANEL, TOUCH PANEL DISPLAY DEVICE, LIQUID CRYSTAL DISPLAY DEVICE, AND ORGANIC EL DISPLAY DEVICE

CROSS-REFERENCE TO RELATED APPLICATIONS

This application is a continuation application of International Application No. PCT/JP2015/069508, filed Jul. 7, 2015, the disclosure of which is incorporated herein by reference in its entirety. Further, this application claims priority from Japanese Patent Application No. 2014-147511, filed Jul. 18, 2014, the disclosure of which is incorporated herein by reference in its entirety.

BACKGROUND OF THE INVENTION

1. Field of the Invention

The present invention relates to a photosensitive composition, a method for producing a cured film, a cured film, a touch panel, a touch panel display device, a liquid crystal display device, and an organic EL display device.

2. Description of the Related Art

Flat panel displays such as a liquid crystal display device, and an organic EL display device are widely used. In recent years, in the production steps of these displays, from the viewpoints of reduction of damage to a substrate or a circuit, energy saving, and the like, it has been required to lower heating temperatures of various cured films in the production steps.

As such a curable composition, for example, JP5201066B discloses a thermosetting resin composition formed by dissolving a copolymer of an unsaturated carboxylic acid and/or unsaturated carboxylic anhydride, an epoxy group containing radically polymerizable compound, and monoolefinically unsaturated compound in an organic solvent. JP2000-080169A discloses an actinic energy ray curable coating composition.

SUMMARY OF THE INVENTION

However, the curable composition described in JP5201066B is required to have a heating temperature of 200° C. or higher, and when the curable composition is heated at a low temperature (for example, 180° C. or lower, further 150° C. or lower), the strength of the film is not sufficient and there is a problem in reliability quality such as artificial sweat resistance. In addition, regarding the curable composition described in JP2000-080169A, the film strength during curing at a low temperature is evaluated but there is no description of patternability by photolithography.

An object of the present invention is to solve the above problems and to provide a photosensitive composition capable of obtaining a cured film having excellent reliability even when being heated at a low temperature and patterning by photolithography. Another object of the present invention is to provide a method for producing a cured film and a cured film using the photosensitive composition, a touch panel, and various display devices, such as an organic EL display device, a liquid crystal display device, and a touch panel display device, using the cured film.

The problems of the present invention are solved by means of the following <1>, <9>, <11>, or <15> to <18>. <2> to <8>, <10>, and <12> to <14>, which are preferable embodiments, are also described below.

<1> A photosensitive composition comprising: a polymerizable monomer having three or more (meth)acryloyl groups and one or more carboxy groups in a molecule as Component A; a polymerizable monomer having three or more (meth)acryloyl groups and not having a carboxy group in a molecule as Component B; a photopolymerization initiator as Component C; a solvent as Component D; a blocked isocyanate compound as Component N; and a polymerization inhibitor as Component K, in which a content of Component A is 10% to 50% by mass with respect to a total content of Component A and Component B.

<2> The photosensitive composition according to <1>, in which a content of Component N is 0.1% to 20% by mass with respect to a total solid content of the photosensitive composition.

<3> The photosensitive composition according to <1> or <2>, in which the content of Component A is 10% to 30% by mass with respect to the total content of Component A and Component B.

<4> The photosensitive composition according to any one of <1> to <3>, further comprising: an alkoxysilane compound as Component S.

<5> The photosensitive composition according to any one of <1> to <4>, further comprising: inorganic particles as Component E.

<6> The photosensitive composition according to <5>, in which a content of Component E is 10% to 40% by mass with respect to a total solid content of the photosensitive composition.

<7> The photosensitive composition according to any one of <1> to <6>, in which the total content of Component A and Component B is 30% to 99% by mass with respect to a total organic solid content of the photosensitive composition.

<8> The photosensitive composition according to any one of <1> to <7>, in which a content of the polymer components is 10% by mass or less with respect to the total solid content of the photosensitive composition.

<9> A method for producing a cured film comprising at least Steps 1 to 5 in this order:

Step 1: an application step of applying the photosensitive composition according to any one of <1> to <8> to a substrate;

Step 2: a solvent removing step of removing a solvent from the applied photosensitive composition;

Step 3: an exposure step of exposing at least a part of the photosensitive composition from which a solvent is removed to actinic rays;

Step 4: a development step of developing the exposed photosensitive composition with an aqueous developer; and Step 5: a heat treatment step of carrying out a heat treatment on the developed photosensitive composition.

<10> The method for producing a cured film according to <9>, in which the temperature of the heat treatment in Step 5 is 80° C. to 180° C.

<11> A cured film that is formed by curing the photosensitive composition according to any one of <1> to <8>.

<12> The cured film according to <11> that is an interlayer insulation film or an overcoat film.

<13> The cured film according to <11> or <12> that is an overcoat film for a touch panel.

<14> The cured film according to any one of <11> to <13> that is an overcoat film for an on-cell structure touch panel.

<15> A touch panel comprising: the cured film according to any one of <11> to <14>.

<16> A touch panel display device comprising: the cured film according to any one of <11> to <14>.

<17> A liquid crystal display device comprising: the cured film according to <11> or <12>.

<18> An organic EL display device comprising: the cured film according to <11> or <12>.

According to the present invention, it is possible to provide a photosensitive composition capable of obtaining a cured film having excellent reliability even when being heated at a low temperature and patterning by photolithography. It is also possible to provide a method for producing a cured film and a cured film using the photosensitive composition, a touch panel and various display devices, such as an organic EL display device, a liquid crystal display device, and a touch panel display device, using the cured film.

BRIEF DESCRIPTION OF THE DRAWINGS

FIG. 1 is a schematic cross-sectional view showing a substrate of a bottom emission type organic EL display device and a flattened film 4 is provided.

FIG. 2 is a schematic cross-sectional view showing an active matrix substrate of a liquid crystal display device and a cured film 17 which is an interlayer insulation film is provided.

DESCRIPTION OF THE PREFERRED EMBODIMENTS

Figure 1:
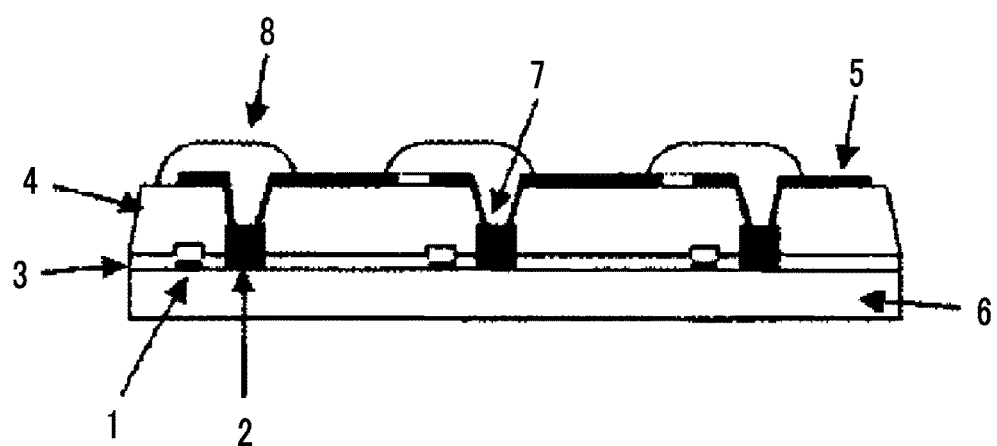
FIG. 1 is a schematic configuration view showing an example of an organic EL display device.

Hereinafter, the contents of the present invention will be described in detail. The description of the constitution requirements to be described below is made on the basis of representative embodiments of the present invention, but the present invention is not limited to these embodiments. The numerical range represented by the term "to" in the specification include the numerical values set forth before and after "to" as lower and upper limits, respectively. In addition, an organic EL element in the present invention refers to an organic electroluminescent element.

With respect to the expression of a group (atomic group) used in the present specification, the expression even when there is no mention of "substituted and unsubstituted" encompasses groups not only having no substituent but also having substituents. For example, the expression "alkyl groups" encompasses not only alkyl groups having no substituent (unsubstituted alkyl groups) but also alkyl groups having substituents (substituted alkyl groups).

In the present specification, the expression "(meth)acrylate" denotes acrylate and methacrylate, "(meth)acrylic" denotes acrylic and methacrylic, and the expression "(meth)acryloyl" denotes acryloyl and methacryloyl.

In addition, in the present invention, "% by mass" and "% by weight" are the same and "parts by mass" and "parts by weight" are the same.

Further, in the present invention, a combination of preferable embodiments is more preferable.

In the present invention, the molecular weight of a polymer component is the weight-average molecular weight in terms of polystyrene measured by gel permeation chromatography (GPC) in the case of using tetrahydrofuran (THF) as a solvent.

(Photosensitive Composition)

A photosensitive composition of the present invention (hereinafter, simply refers to a "photosensitive composition" or "composition") contains a polymerizable monomer having three or more (meth)acryloyl groups and one or more carboxy groups in a molecule as Component A, a polymerizable monomer having three or more (meth)acryloyl groups and not having a carboxy group in a molecule as Component B, a photopolymerization initiator as Component C, a solvent as Component D, a blocked isocyanate compound as Component N, and a polymerization inhibitor as Component K, and a content of Component A is 10% to 50% by mass with respect to a total content of Component A and Component B.

The photosensitive composition of the present invention may further include an alkoxysilane compound as Component S and other components such as inorganic particles as Component E.

It is preferable that the photosensitive composition of the present invention can be patterned with an alkali developer by photolithography. In the case in which the photosensitive composition of the present invention is patterned with an alkali developer by photolithography, the formed pattern is a pattern of negative type in which a photosensitive portion remains as a pattern.

Specifically, the composition including the following components are shown as examples of specific embodiments.

First Embodiment

Component A: Polymerizable monomer having three or more (meth)acryloyl groups and one or more carboxy groups in a molecule
Component B: Polymerizable monomer having three or more (meth)acryloyl groups and not having a carboxy group in a molecule
Component C: Photopolymerization initiator
Component D: Solvent
Component N: Blocked isocyanate compound
Component K: Polymerization inhibitor Second Embodiment Component A: Polymerizable monomer having three or more (meth)acryloyl groups and one or more carboxy groups in a molecule
Component B: Polymerizable monomer having three or more (meth)acryloyl groups and not having a carboxy group in a molecule
Component C: Photopolymerization initiator
Component D: Solvent
Component E: Inorganic particles
Component N: Blocked isocyanate compound
Component K: Polymerization inhibitor Third Embodiment Component A: Polymerizable monomer having three or more (meth)acryloyl groups and one or more carboxy groups in a molecule Component B: Polymerizable monomer having three or more (meth)acryloyl groups and not having a carboxy group in a molecule
Component C: Photopolymerization initiator
Component D: Solvent
Component N: Blocked isocyanate compound
Component K: Polymerization inhibitor
Component S: Alkoxysilane compound Fourth Embodiment Component A: Polymerizable monomer having three or more (meth)acryloyl groups and one or more carboxy groups in a molecule
Component B: Polymerizable monomer having three or more (meth)acryloyl groups and not having a carboxy group in a molecule
Component C: Photopolymerization initiator
Component D: Solvent
Component E: Inorganic particles
Component N: Blocked isocyanate compound
Component K: Polymerization inhibitor
Component S: Alkoxysilane compound Fifth Embodiment An embodiment that is obtained by further blending a surfactant with any of the first to fourth embodiments As a result of intensive investigations, the present inventors have been found that the photosensitive composition containing Component A to Component D, Component N, and Component K described above and having a content of Component A within a predetermined range with respect to the total content of Component A and Component B has excellent reliability when being formed into a cured film and can be patterned by photolithography, thereby completing the present invention.

Although the action mechanism of the present invention is not clear, it is assumed as follows. It considered that by incorporating Component A into the composition, a carboxyl group is introduced into the composition, which enables an uncured portion to be developed. It is also assumed that by controlling the amount of Component A to be within a predetermined range this time, a cured film that can be patterned and has excellent reliability can be obtained. The cured film that has excellent reliability refers to a cured film that has excellent sweat resistance.

Hereinafter, each component that is contained in the photosensitive composition of the present invention will be described.

Component A: Polymerizable Monomer Having Three or More (Meth)Acryloyl Groups and One or More Carboxy Groups in Molecule The photosensitive composition of the present invention contains a polymerizable monomer having three or more (meth)acryloyl groups and one or more carboxy groups in a molecule as Component A.

Component A is a compound having three or more (meth)acryloyl groups and one or more carboxy groups in a molecule.

Component A may be a low molecular compound or may be an oligomer but not a polymer. That is, from the viewpoint of the hardness of the cured film, Component A has a molecular weight (a weight-average molecular weight in the case in which a molecular weight distribution is formed) of 10,000 or less, preferably 5,000 or less, and more preferably 3,000 or less.

Component A has three or more (meth)acryloyl groups in a molecule. The number of (meth)acryloyl groups in a molecule (in one molecule) is preferably 3 to 15, more preferably 3 to 10, and still more preferably 3 to 7.

When the number of (meth)acryloyl groups is within the above range, excellent hardness and reactivity are obtained.

Component A may have three or more acryloyl groups (—C(=O)—CH=CH$_2$) or methacryloyl groups (—C(=O)—C(CH$_3$)=CH$_2$) in one molecule in total but preferably has three or more acryloyloxy groups (—O—C(=O)—CH=CH$_2$) and methacryloyloxy groups (—O—C(=O)—C(CH$_3$)=CH$_2$). In addition, Component A preferably has three or more acryloyl groups and more preferably three or more acryloyloxy groups.

Compared to a methacryloyl group, an acryloyl group is preferable from the viewpoint of excellent curability (reactivity). In addition, a (meth)acryloyloxy group is preferable from the viewpoint of excellent reactivity and easy synthesis.

Component A has one or more carboxy groups in a molecule (in one molecule). The number of carboxy groups in one molecule is preferably 1 to 6, more preferably 1 to 3, still more preferably 1 or 2, and particularly preferably 1.

It is preferable that the number of carboxy groups included in one molecule of Component A is within the above range from the viewpoint of excellent developability and adhesiveness to a substrate.

The carboxy group included in Component A may form a salt. A cation that forms a salt is preferably an organic cationic compound, a transition metal coordinated complex cation, or a metallic cation. Examples of the organic cationic compound include a quaternary ammonium cation, a quaternary pyridinium cation, a quaternary quinolinium cation, a phosphonium cation, an iodonium cation, and a sulfonium cation. Examples of the transition metal coordinated complex cation include compounds described in JP279143B. Examples of the metallic cation include Na$^+$, K$^+$, Li$^+$, Ag$^+$, Fe$^{2+}$, Fe$^{3+}$, Cu$^+$, Cu$^{2+}$, Zn$^{2+}$, Al$^{3+}$, and Ca$^{2+}$.

It is preferable that Component A does not have acid groups other than the above-described carboxy group. Examples of the acid group other than the carboxy group include a sulfonic acid group, and a phosphonic acid group. When Component A has acid groups other than the carboxy group, adhesiveness to a substrate may deteriorate in some cases.

Component A is preferably a polymerizable monomer which is an ester of a polyhydroxy compound and an unsaturated carboxylic acid and has an acid group (carboxy group) by allowing to react an unreacted hydroxy group of a polyhydroxy compound with a carboxylic acid anhydride, and a polyhydroxy compound is particularly preferably pentaerythritol and/or dipentaerythritol.

Component A can be obtained by, for example, adding acid anhydride to a compound having three or more (meth)acryloyl groups and a hydroxy group (hereinafter, also referred to as a "polyfunctional hydroxy (meth)acrylate").

Examples of the polyfunctional hydroxy (meth)acrylate include an ester of a polyhydroxy compound having four or more hydroxy groups and a (meth)acrylic acid.

The polyhydroxy compound having four or more hydroxy groups is preferably an aliphatic polyhydroxy compound, and specific examples thereof include diglycerol, ditrimethylolethane, ditrimethylolpropane, ditrimethylolbutane, ditrimethylolhexane, pentaerythritol, dipentaerythritol, and tripentaerythritol. Among these, pentaerythritol and dipentaerythritol are preferable.

In addition, as the polyhydroxy compound, alkylene oxide adducts of the polyhydroxy compounds mentioned as examples may be used and as the alkylene oxide, ethylene oxide, propylene oxide, and the like may be used.

A method for producing a polyfunctional hydroxy (meth)acrylate is not particularly limited and a known method may be appropriately adopted. Specifically, a method including heating and stirring a polyhydroxy compound and (meth)acrylic acid in the presence of an acidic catalyst may be used. Examples of the acidic catalyst include sulfuric acid, paratoluensulfonic acid, and methanesulfonic acid. In addition, the reaction temperature may be appropriately set depending on a compound to be used and the purpose of use, but the reaction temperature is preferably 70° C. to 140° C. When the reaction temperature is within the above temperature range, the reaction is promoted or the reaction proceeds stably, thereby preventing formation of impurities or gelation.

It is preferable to promote water removal under azeotropic distillation using an organic solvent exhibiting low solubility in water that is produced by esterification reaction at the time of reaction. Preferable examples of the organic solvent include aromatic hydrocarbons such as toluene, benzene and xylene, aliphatic hydrocarbons such as hexane and heptane, and ketones such as methyl ethyl ketone and cyclohexanone. The organic solvent can be distilled off under reduced pressure after the reaction.

Further, it is possible to add a polymerization inhibitor into the reaction solution for the purpose of preventing polymerization of the obtained (meth)acrylic ester. Examples of the polymerization inhibitor include hydroquinone, hydroquinone monomethyl ether, 2,6-ditertiary butyl-p-cresol, and phenothiazine.

Component A is obtained by the reaction of the polyfunctional hydroxy (meth)acrylate and an acid anhydride.

Examples of the acid anhydride include compounds having one acid anhydride group in the same molecule such as succinic anhydride, 1-dodecenyl succinic anhydride, maleic anhydride, glutaric anhydride, itaconic anhydride, phthalic anhydride, hexahydrophthalic anhydride, methylhexahydrophthalic anhydride, tetramethylene maleic anhydride, tetrahydrophthalic anhydride, methyltetrahydrophthalic anhydride, endomethylene tetrahydrophthalic anhydride, methylendomethylene tetrahydrophthalic anhydride, tetrachlorophthalic anhydride, tetrabromophthalic anhydride, and trimellitic anhydride; compounds having two acid anhydride groups in the same molecules such as pyromellitic anhydride, phthalic anhydride dimer, diphenylether tetracarboxylic dianhydride, diphenylsulphone tetracarboxylic dianhaydride, benzophenonetetracarboxylic dianhydride, and 1,2,3,4-butane tetracarboxylic dianhydride, diphenyl ether tetracarboxylic anhydride, and trimellitic anhydride-.ethylene glycol ester (as a commercially available product, there is, for example, TMEG-100, manufactured by New Japan Chemical Co., Ltd.).

Among these, compounds having one acid anhydride group in the same molecule are preferable.

Component A may be produced according to a typical method.

For example, a method of allowing a polyfunctional hydroxy (meth)acrylate and a carboxylic acid anhydride to react at 60° C. to 110° C. for 1 to 20 hours in the presence of a catalyst, or the like may be used. Examples of the catalyst used in this case include N,N-dimethylbenzylamine, triethylamine, tributylamine, triethylenediamine, benzyltrimethyl ammonium chloride, benzyltriethyl ammonium bromide, tetramethyl ammonium bromide, cetyltrimethyl ammonium bromide, and zinc oxide.

Component A is preferably a compound represented by Formula A-1 or a compound represented by Formula A-2.

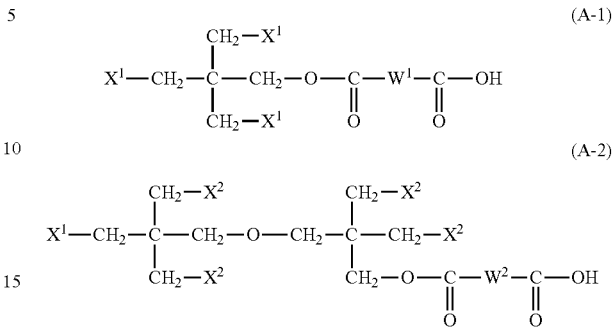

In Formula A-1, $X^1$ represents an acryloyloxy group or a methacryloyloxy group, and $W^1$ represents an alkylene group having 1 to 6 carbon atoms, an alkenylene group having 2 to 6 carbon atoms, or a phenylene group.

In Formula A-2, $X^2$ represents a hydrogen atom, an alkyl group having 1 to 6 carbon atoms, an acryloyloxy group, or a methacryloyloxy group, at least three of five $X^2$s each represent an acryloyloxy group or a methacryloyloxy group, and $W^2$ represents an alkylene group having 1 to 6 carbon atoms, an alkenylene group having 2 to 6 carbon atoms, or a phenylene group.

In Formula A-1, $X^1$ is preferably an acryloyloxy group.

In Formula A-1, $W^1$ represents an alkylene group having 1 to 6 carbon atoms, an alkenylene group having 2 to 6 carbon atoms, or a phenylene group, and the alkylene group having 1 to 6 carbon atoms may be linear, branched, or cyclic. The alkylene group preferably has 2 to 6 carbon atoms and examples thereof include an ethylene group, a propylene group, a butylene group, a pentyl group, a hexylene group, and a cyclohexylene group.

In Formula A-1, $W^1$ is preferably an alkylene group having 1 to 6 carbon atoms, more preferably an alkylene group having 2 to 6 carbon atoms, still more preferably an alkylene group having 2 or 3 carbon atoms, and particularly preferably an ethylene group.

In Formula A-2, at least three of five $X^2$s each represent an acryloyloxy group or a methacryloyloxy group and preferably represents an acryloyloxy group. Among five $X^2$s, three to five $X^2$s each represent an acryloyloxy group or a methacryloyloxy group, four to five $X^2$s each preferably represent an acryloyloxy group or a methacryloyloxy group, and five $X^2$s more preferably represent an acryloyloxy group or a methacryloyloxy group.

In addition, $X^2$ other than an acryloyloxy group or a methacryloyloxy group represents a hydrogen atom, or an alkyl group having 1 to 6 carbon atoms. The alkyl group having 1 to 6 carbon atoms may be a linear, branched, or cyclic alkyl group. Among these, $X^2$ other than a (meth)acryloyloxy group is preferably a hydrogen atom or an alkyl group having 1 to 4 carbon atoms, more preferably a hydrogen atom, a methyl group, or an ethyl group, and still more preferably a hydrogen atom.

In Formula A-2, $W^2$ is the same as $W^1$ in Formula A-1 and a preferable range thereof is also the same as in Formula A-1.

As Component A, a commercially available product may be used and examples thereof include M-510, M-520, TO-2349, and TO-2359 of ALLO-NIX (registered trademark) series as polybasic acid-modified acrylic oligomers manufactured by Toagosei Co., Ltd.

Component A may be used alone or as a combination of two or more types thereof.

The content of Component A is preferably 3% to 49.5% by mass, more preferably 3% to 45% by mass, still more preferably 5% to 40% by mass, and most preferably 10% to 35% by mass with respect to the total organic solid content of the photosensitive composition.

In the present invention, the "solid content" in the photosensitive composition means components excluding a volatile component such as an organic solvent. In addition, the "organic solid content" means components excluding a volatile component such as an organic solvent and an inorganic component such as inorganic particles from the photosensitive composition.

Component B: Polymerizable Monomer Having Three or More (Meth)Acryloyl Groups and not Having Carboxy Group in Molecule The photosensitive composition of the present invention contains a polymerizable monomer having three or more (meth)acryloyl groups and not having a carboxy group in a molecule as Component B. Component B is a polymerizable monomer having three or more (meth)acryloyl groups in a molecule (in one molecule) which is different from Component A. It is preferable that Component B does not have a carboxy group in the molecule or other acid groups, and examples of other acid groups include a sulfonic acid group and a phosphoric acid group.

Component B may be a low molecular compound, oligomer, or polymer. That is, Component B has a molecular weight (the weight-average molecular weight in the case of forming a molecular weight distribution) of 10,000 or less, preferably 5,000 or less, and still more preferably 3,000 or less from the viewpoint of the hardness of a cured film.

Component B has three or more (meth)acryloyl groups in a molecule. The number of (meth)acryloyl groups is preferably 3 to 15, more preferably 3 to 10, and still more preferably 3 to 6. By adopting the configuration, the effect of the present invention is exhibited.

As Component B, a compound that is applied to this type of composition can be appropriately selected and used, and for example, among the components described in a paragraph 0011 of JP2006-23696A and the components described in paragraphs 0031 to 0047 of JP2006-64921A, a compound having three or more (meth)acryloyl groups in a molecule may be used. The description of these components is incorporated in the present specification.

As Component B, (meth)acrylic esters of polyhydroxy compounds are preferably exemplified. Specific example thereof include pentaerythritol tri(meth)acrylate, pentaerythritol tetra(meth)acrylate, dipentaerythritol penta(meth)acrylate, dipentaerythritol hexa(meth)acrylate, tri((meth)acryloyloxyethyl) isocyanurate, trimethylolpropane tri(meth)acrylate, ethylene oxide (EO)-modified pentaerythritol tetra(meth) acrylate, and EO-modified dipentaerythritol hexa(meth)acrylate.

As Component B, a commercially available product may be used and examples thereof include ARONIX (registered trademark) M-309, M-400, M-405, M-450, M-7100, M-8030, M-8060, TO-1382, and TO-1450 (manufactured by Toagosei Co., Ltd.), KAYARAD TMPTA, DPHA, DPCA-20, DPCA-30, DPCA-60, and DPCA-120 (manufactured by Nippon Kayaku Co., Ltd.), and VISCOAT 295, 300, 360, GPT, 3PA, and 400 (manufactured by Osaka Organic Chemical Industry, Ltd.).

A compound which corresponds to Component B and also corresponds to an alkoxysilane compound, which will be described later, is an alkoxysilane compound.

<Urethane (Meth)Acrylate>

In the present invention, as Component B, urethane (meth)acrylate may be used.

As urethane (meth)acrylate that can be used in the present invention, urethane-added polymerizable compounds produced using an addition reaction of isocyanate and a hydroxy group are exemplified and urethane acrylates described in JP1976-37193A (JP-S51-37193A), JP1990-32293B (JP-H02-32293B), and JP-1990-16765B (JP-H02-16765B) are exemplified. The description of these components is incorporated in the present specification.

The molecular weight of the urethane (meth)acrylate is preferably 500 to 10,000, more preferably 650 to 6,000, and still more preferably 800 to 3,000 from the viewpoint of the hardness of a cured film.

By adopting such a configuration, the effect of the present invention is more effectively exhibited.

The (meth)acryloyloxy group in the urethane (meth)acrylate may be either or both of an acryloyloxy group or a methacryloyloxy group. However, an acryloyloxy group is preferable.

The number of (meth)acryloxy groups in the urethane (meth)acrylate is 3 or more, more preferably 6 or more, and still more preferably 10 or more. In the above embodiment, the effect of the present invention is more effectively exhibited.

In addition, the upper limit of the number of the (meth)acryloxy groups is not particularly limited and is preferably 50 or less, more preferably 30 or less, and still more preferably 20 or less.

The curable composition of the present invention may include only one type or two or more types of urethane (meth)acrylates.

The (meth)acryloxy group in the urethane (meth)acrylate may be either or both of an acryloxy group and a methacryloxy group but an acryloxy group is preferable.

The number of urethane bonds in the urethane (meth)acrylate is not particularly limited and is preferably 1 to 30, more preferably 1 to 20, still more preferably 2 to 10, particularly preferably 2 to 5, and most preferably 2 or 3.

The urethane (meth)acrylate is preferably an aliphatic urethane (meth)acrylate.

In addition, the urethane (meth)acrylate preferably has an isocyanuric ring structure.

Further, the urethane (meth)acrylate is preferably a compound including a core portion having one or more urethane bonds and a terminal portion having one or more (meth)acryloxy groups, more preferably a compound having two or more above terminals bonded to the core, still more preferably a compound having two to five above terminals bonded to the core, and particularly preferably a compound having two or three above terminals bonded to the core.

The urethane (meth)acrylate is preferably a compound at least having a group represented by Formula Ae-1 or Ae-2 below and more preferably a compound at least having a group represented by Formula Ae-1 below. In addition, the urethane (meth)acrylate is more preferably a compound having two or more groups selected from the group consisting of groups represented by Formulae Ae-1 and Ae-2 below.

Further, the terminal portion of the urethane (meth)acrylate is preferably a group represented by Formula Ae-1 or Ae-2 below.

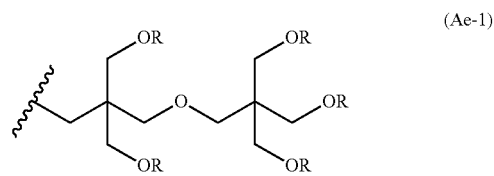

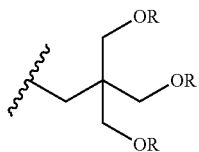

(Ae-2)

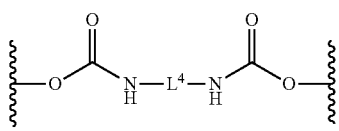

(Ac-2)

In Formulae Ae-1 and Ae-2, R represents an acrylic group or a methacrylic group and the wavy portion represents a position for bonding to other structures.

In addition, the urethane (meth)acrylate is preferably a compound at least having a group represented by Formula Ac-1 or Ac-2 below and more preferably a compound at least having a group represented by Formula Ac-1 below.

Further, the core portion in the urethane (meth)acrylate is preferably a group represented by Formula Ac-1 or Ac-2.

(Ac-1)

In Formulae Ac-1 and Ac-2, $L^1$ to $L^4$ each independently represent a divalent hydrocarbon group having 2 to 20 carbon atoms and the wavy portion represents a position for bonding to other structures.

$L^1$ to $L^4$ each independently represent preferably an alkylene group having 2 to 20 carbon atoms, more preferably an alkylene group having 2 to 10 carbon atoms, and still more preferably an alkylene group having 4 to 8 carbon atoms. In addition, the alkylene group may have a branched or cyclic structure but is preferably a linear alkylene group.

Further, the urethane (meth)acrylate is particularly preferably a compound obtained by bonding a group represented by Formula Ac-1 or Ac-2 and two or three groups selected from the group consisting of groups represented by Formulae Ae-1 and Ae-2.

Hereinafter, examples of the urethane (meth)acrylate which is preferably used in the present invention will be shown but needless to say, the present invention is not limited thereto.

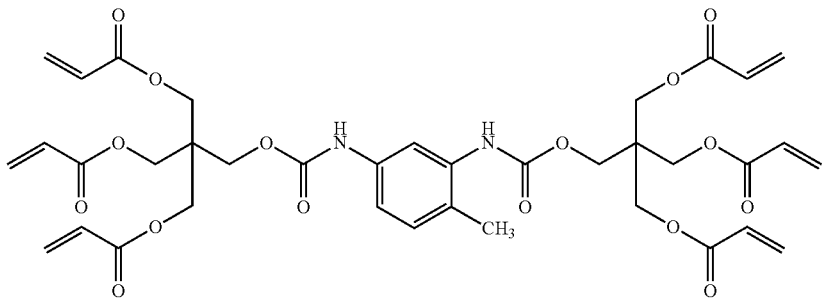

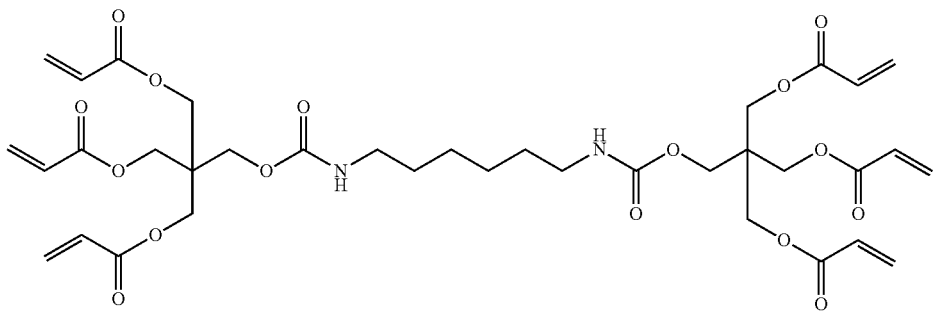

-continued

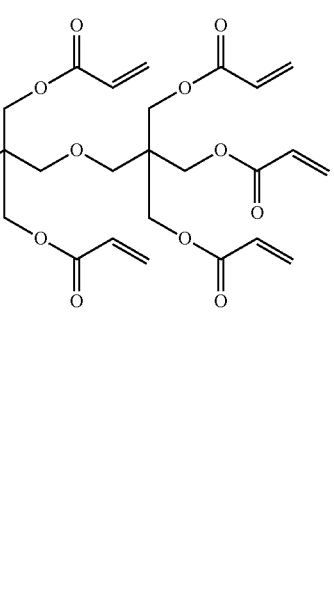
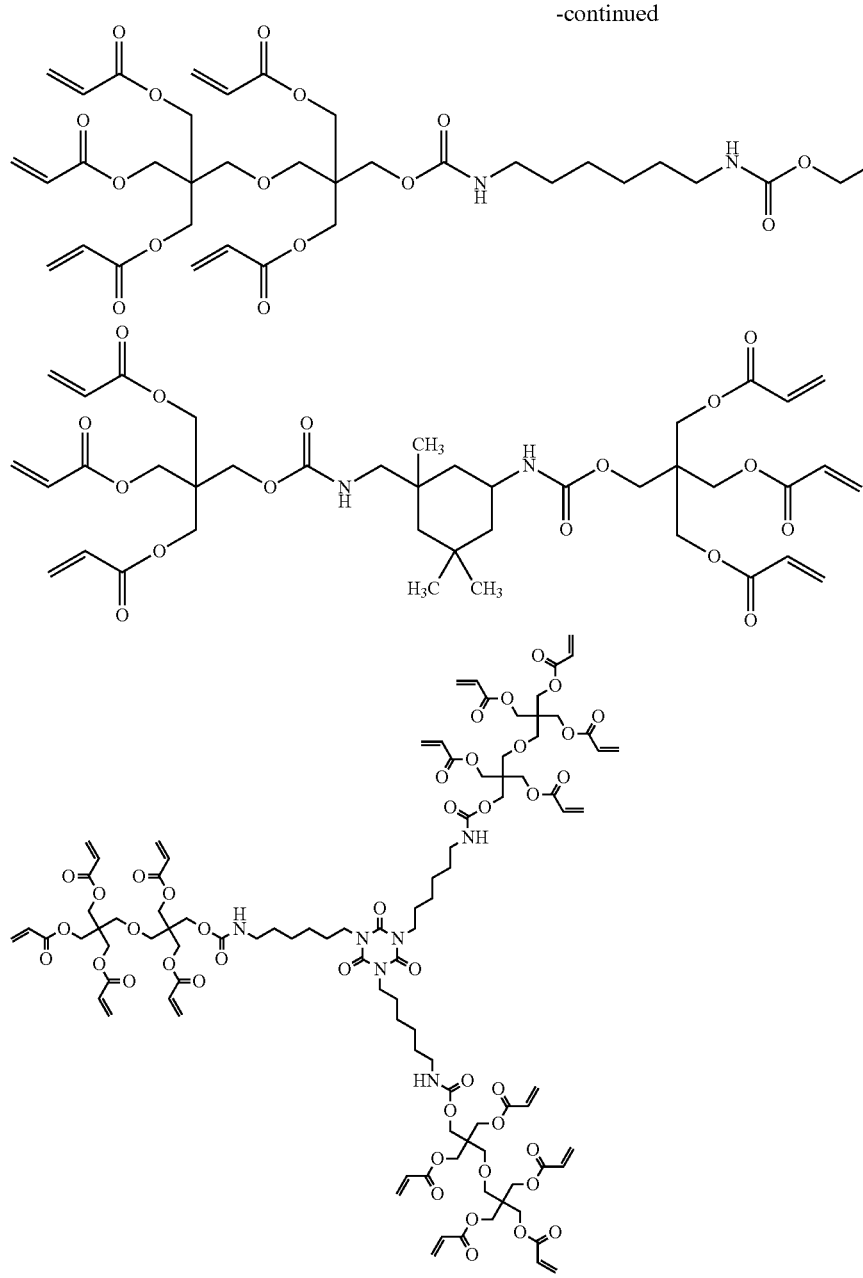

As urethane (meth)acrylate that can be used in the present invention, urethane-added polymerizable compounds produced using an addition reaction of isocyanate and a hydroxy group are exemplified and urethane acrylates described in JP1976-37193A (JP-S51-37193A), JP1990-32293B (JP-H02-32293B), and JP-1990-16765B (JP-H02-16765B) are exemplified. The description of these components is incorporated in the present specification.

Examples of commercially available products of the urethane (meth)acrylate include U-6HA, UA-1100H, U-6LPA, U-15HA, U-6H, U-10HA, U-10PA, UA-53H, and UA-33H (all registered trademark), available from Shin-Nakamura Chemical Co., Ltd., UA-306H, UA-306T, UA-306I, and UA-510H, available from KYOEISHA CHEMICAL Co., Ltd., Laromer UA-9048, UA-9050, and PR9052, available from BASF GmbH., and EBECRYL 220, 5129, and 8301, KRM 8200, 8200AE, and 8452, available from DAICEL-ALLNEX LTD. ALL.

Component B may be used alone or as a combination of two or more types thereof.

The content of Component B is preferably 20% to 85% by mass, more preferably 30% to 80% by mass, and still more preferably 45% to 75% by mass with respect to the total organic solid content of the photosensitive composition.

The content of Component A in the present invention is 10% to 50% by mass with respect to the total content of Component A and Component B. When the content of Component A is less than 10% by mass component with respect to the total content of Component A and Component B, the amount of the carboxy group in the composition is small and developability (patternability) deteriorates. In addition, when the content of the carboxy group is more than 50% by mass, reliability of sweat resistance or the like deteriorates.

The content of Component A is preferably 12% to 40% by mass, more preferably 15% to 35% by mass, and still more preferably 18% to 30% by mass with respect to the total content of Component A and Component B.

In addition, in the present invention, the total content of Component A and Component B is preferably 40% by mass or more with respect to the total organic solid content of the photosensitive composition. When the total content of Component A and Component B is within the above range, developability and the reliability of a cured film are excellent.

The total content of Component A and Component B is preferably 30% to 99% by mass, more preferably 40% to 99% by mass, still more preferably 50% to 98% by mass, and most preferably 60% to 95% by mass with respect to the total organic solid content of the photosensitive composition.

Component C: Photopolymerization Initiator

The photosensitive composition of the present invention contains a photopolymerization initiator as Component C.

The photopolymerization initiator preferably contains a radical polymerization initiator.

The photopolymerization initiator that can be used in the present invention includes compounds capable of initiating and acerbating polymerization with light. Among these, a photoradical polymerization initiator is more preferable.

The "light" is not particularly limited as long as an actinic energy ray can impart energy capable of generating an initiation species by its irradiation using Component C and widely includes α-ray, γ-ray, X-ray, ultraviolet ray (UV), visible ray, and electron beam. Among these, light at least including ultraviolet ray is preferable.

Examples of the photopolymerization initiator include an oxime ester compound, an organic halogenated compound, an oxydiazole compound, a carbonyl compound, a ketal compound, a benzoin compound, an acridine compound, an organic peroxide compound, an azo compound, a coumarin compound, an azide compound, a metallocene compound, a hexaarylbiimidazole compound, an organic boric acid compound, a disulfonic acid compound, an onium salt compound, and an acylphosphine (oxide) compound. Among these, from the viewpoint of sensitivity, an oxime ester compound and a hexaarylbiimidazole compound are preferable, and an oxime ester compound is more preferable.

As the oxime ester compound, compounds described in JP2000-80068A, JP2001-233842A, JP2004-534797A, JP2007-231000A, and JP2009-134289A may be used.

The oxime ester compound is preferably a compound represented by Formula 1 or 2 below.

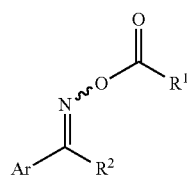
(1)

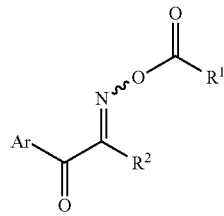
(2)

In Formula 1 or 2, Ar represents an aromatic group or a heteroaromatic group, $R^1$ represents an alkyl group, an aromatic group, or an alkyloxy group, $R^2$ represents a hydrogen atom or an alkyl group, and $R^2$ may be further bonded to an Ar group to form a ring.

Ar represents an aromatic group or a heteroaromatic group, and is preferably a group obtained by removing one hydrogen atom from the aromatic ring of a benzene ring compound, a naphthalene ring compound, or a carbazole ring compound and more preferably a naphthalene group or a carbazole group that is bonded to $R^2$ to form a ring. Examples of the hetero atom in the hetero aromatic group include a nitrogen atom, an oxygen atom, and a sulfur atom.

$R^1$ is preferably an alkyl group, an aromatic group, or an alkyloxy group and more preferably a methyl group, an ethyl group, a benzyl group, a phenyl group, a naphthyl group, a methoxy group, or an ethoxy group, and more preferably a methyl group, an ethyl group, a phenyl group, or a methoxy group.

$R^2$ represents a hydrogen atom or an alkyl group, is preferably a hydrogen atom or a substituted alkyl group, and is more preferably a hydrogen atom, a substituted alkyl group that forms a ring with Ar, or a toluene thioalkyl group.

In addition, Ar is preferably a group having 4 to 20 carbon atoms, $R^1$ is preferably a group having 1 to 30 carbon atoms, and $R^2$ is preferably a group having 1 to 50 carbon atoms.

The oxime ester compound is more preferably a compound represented by Formula 3, 4 or 5.

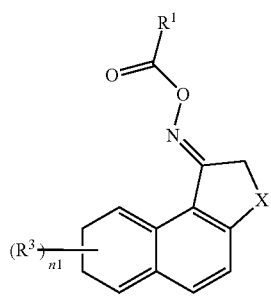
(3)

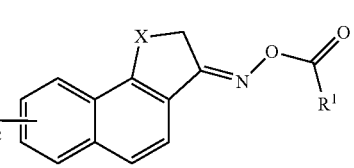
(4)

(5)

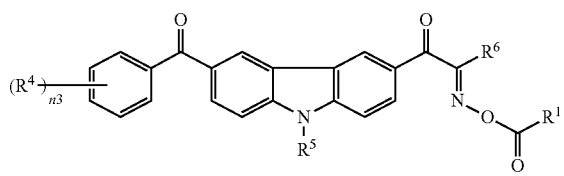

In Formulae 3 to 5, $R^1$ represents an alkyl group, an aromatic group, or an alkoxy group, X represents —$CH_2$—, —$C_2H_4$—, —O— or S—, $R^3$ represents a halogen atom, $R^4$ represents an alkyl group, a phenyl group, an alkyl-substituted amino group, an arylthio group, an alkylthio group, an alkoxy group, an aryloxy group, or a halogen atom, $R^5$ represents a hydrogen atom, an alkyl group, or an aryl group, $R^6$ represents an alkyl group, n1 and n2 each independently represent an integer of 0 to 6, and n3 represents an integer of 0 to 5.

$R^1$ represents an alkyl group, an aromatic group, or an alkoxy group and a group represented by $R^{11}$—X'-alkylene group- ($R^{11}$ represents an alkyl group or an aryl group, and X' represents a sulfur atom or an oxygen atom.) is preferable. $R^{11}$ is preferably an aryl group and more preferably a phenyl group. An alkyl group and an aryl group for $R^{11}$ may be substituted by a halogen atom (preferably a fluorine atom, a chlorine atom or a bromine atom) or an alkyl group.

X is preferably a sulfur atom.

$R^3$ and $R^4$ may be bonded at an arbitrary position in the aromatic ring.

$R^4$ represents an alkyl group, a phenyl group, an alkyl-substituted amino group, an arylthio group, an alkylthio group, an alkoxy group, an aryloxy group, or a halogen atom, an alkyl group, a phenyl group, an arylthio group, or a halogen atom is preferable, an alkyl group, an arylthio group, or a halogen atom is more preferable, and an alkyl group or a halogen atom is still more preferable. As the alkyl group, an alkyl group having 1 to 5 carbon atoms is preferable, and a methyl group or an ethyl group is more preferable. As the halogen atom, a chlorine atom, a bromine atom, or a fluorine atom is preferable.

In addition, the number of carbon atoms of $R^4$ is preferably 0 to 50 and more preferably 0 to 20.

$R^5$ represents a hydrogen atom, an alkyl group, or an aryl group, and an alkyl group is preferable. As the alkyl group, an alkyl group having 1 to 5 carbon atoms is preferable, and a methyl group or an ethyl group is more preferable. As the aryl group, an aryl group having 6 to 10 carbon atoms is preferable.

$R^6$ represents an alkyl group, an alkyl group having 1 to 5 carbon atoms is preferable and a methyl group or an ethyl group is more preferable.

n1 and n2 respectively represent the number of substituents of $R^3$ on the aromatic ring in Formula 3 or 4 and n3 represents the number of substituents of $R^4$ on the aromatic ring in Formula 5.

n1 to n3 each independently represent preferably an integer of 0 to 2 and more preferably 0 or 1.

Hereinafter, examples of the oxime ester compound that is preferably used in the present invention will be shown. However, needless to say, the oxime ester compound that is used in the present invention is not limited thereto. Me represents a methyl group, and Ph represents a phenyl group.

In addition, the cis-trans isomerism of the oxime double bond in these compounds may be either of EZ or may be a mixture of EZ.

PI-1

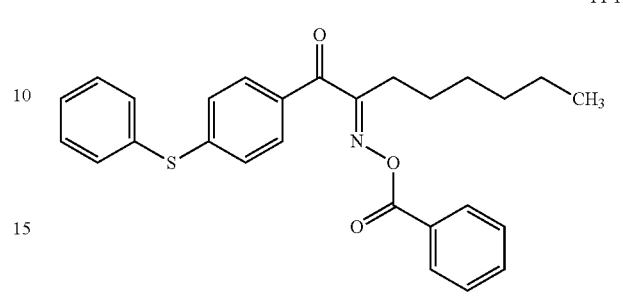

PI-2

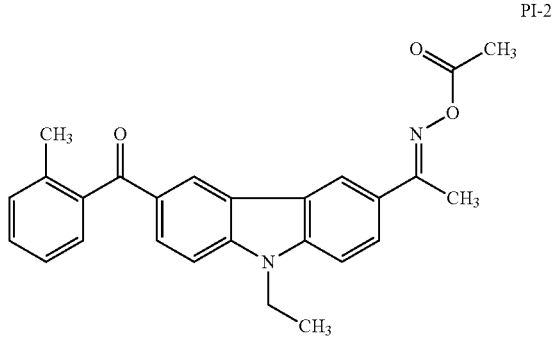

PI-3

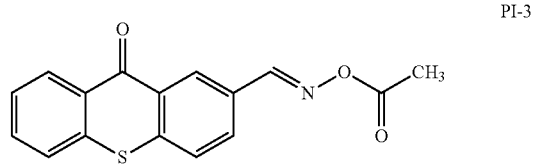

PI-4

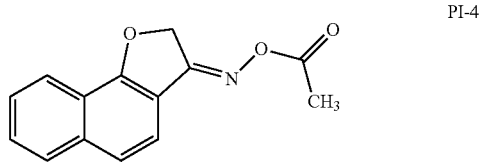

PI-5

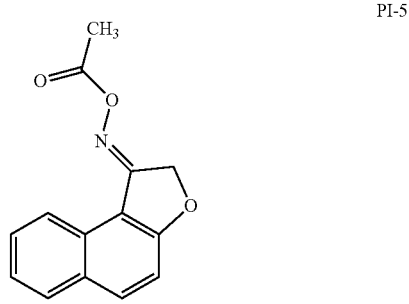

PI-6

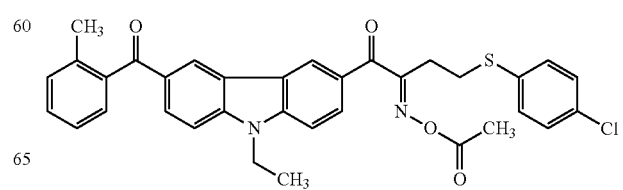

PI-7

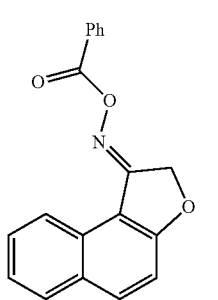

PI-8

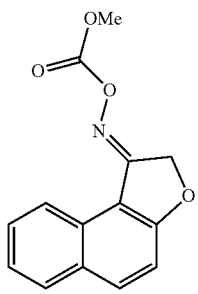

PI-9

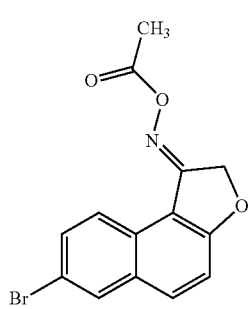

PI-10

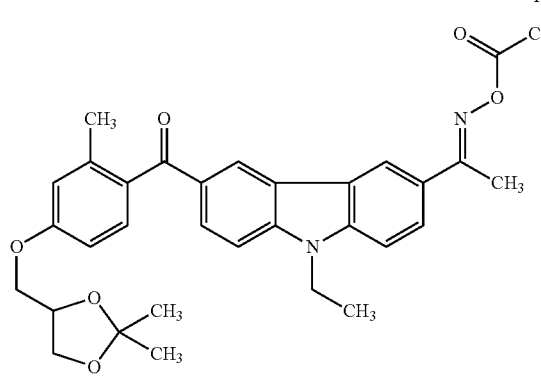

Specific examples of the organic halogenated compound include compounds described in Wakabayashi et al., "Bull Chem. Soc. Japan", 42, 2924 (1969), U.S. Pat. No. 3,905, 815A, JP1971-4605B (JP-546-4605B), JP1973-36281A (JP-548-36281A), JP1980-32070A (JP-555-32070A), JP1985-239736A (JP-560-239736A), JP1986-169835A (JP-561-169835A), JP1986-169837A (JP-561-169837A), JP1987-58241A (JP-562-58241A), JP1987-212401A (JP-562-212401A), JP1988-70243A (JP-563-70243A), JP1988-298339A (JP-563-298339A), and M. P. Hutt, "Journal of Heterocyclic Chemistry" 1 (No. 3), (1970). Particularly, an oxazole compound substituted with a trihalomethyl group and an s-triazine compound may be used.

Examples of the hexaaryl biimidazole compound include various compounds described in each specification of JP1994-29285B (JP-H06-29285B), U.S. Pat. No. 3,479,185A, U.S. Pat. No. 4,311,783A, and U.S. Pat. No. 4,622,286A.

Examples of the acylphosphine (oxide) compound include a monoacylphosphine oxide compound and a bisacylphosphine oxide compound, and specific examples include IRGACURE 819, DAROCUR 4265, and DAROCUR TPO manufactured by BASF GmbH.

The photopolymerization initiator may be used alone or as a combination of two or more types thereof.

The total amount of the photopolymerization initiator in the photosensitive composition of the present invention is preferably 0.5 to 30 parts by mass, more preferably 1 to 20 parts by mass, still more preferably 1 to 10 parts by mass, and particularly preferably 2 to 5 parts by mass with respect to 100 parts by mass of the total solid content in the composition.

The content of the photopolymerization initiator is preferably 0.5% to 30% by mass, more preferably 1% to 20% by mass, still more preferably 1% to 10% by mass, and particularly preferably 1% to 5% by mass with respect to the total organic solid content of the composition.

<Sensitizer>

A sensitizer may be added to the photosensitive composition of the present invention other than the photopolymerization initiator.

The sensitizer absorbs actinic rays or radiations to be in an excited state. The sensitizer in an excited state interacts with Component C and causes the action of electron transfer, energy transfer and heat generation to initiate and promote polymerization.

Examples of typical sensitizers that can be used in the present invention include those disclosed in Crivello [J. V. Crivello, Adv. in Polymer Sci., 62, 1 (1984)]. Specific examples of sensitizers include pyrene, perylene, acridine orange, thioxanthone, 2-chlorothioxanthone, benzoflavin, N-vinylcarbazole, 9,10-dibutoxyanthracene, anthraquinone, coumarin, ketocoumarin, phenanthrene, camphorquinone, and phenothiazine derivatives. The sensitizer may be added preferably at a ratio of 50% to 200% by mass with respect to the photopolymerization initiator.

Component D: Solvent

The photosensitive composition of the present invention contains a solvent as Component D. The photosensitive composition of the present invention is preferably prepared as a solution in which Component A, Component B, Component C, which are required components, Component N and Component K, which will be described later, and optional components, which will be described later, are dissolved in a solvent.

As Component D, an organic solvent is preferable and as an organic solvent used for the photosensitive composition of the present invention, known solvents may be used. Examples thereof include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers, diethylene glycol monoalkyl ether acetates, dipropylene glycol monoalkyl ethers, butylene glycol diacetates, dipropylene glycol dialkyl ethers, dipropylene glycol monoalkyl ether acetates, alcohols, esters, ketones, amides, and lactones. Specific examples of these organic solvents can be referred to paragraph 0062 of JP2009-098616A.

Specifically, propylene glycol monomethyl ether acetate, diethylene glycol diethyl ether, diethylene glycol ethyl methyl ether, propylene glycol monomethyl ether, 1,3-butylene glycol diacetate, cyclohexanol acetate, propylene glycol diacetate, and tetrahydrofurfuryl alcohol are preferable.

The boiling point of the organic solvent is preferably 100° C. to 300° C. and more preferably 120° C. to 250° C. from the viewpoint of coatability.

The solvent that can be used in the present invention may be used alone or as a combination of two or more types thereof. Solvents having different boiling points may be used in combination.

The content of the solvent in the photosensitive composition of the present invention is preferably 100 to 3,000 parts by mass, more preferably 200 to 2,000 parts by mass, and still more preferably 250 to 1,000 parts by mass per 100 parts by mass of the total solid content of the composition from the viewpoint of adjusting the viscosity to be suitable for application.

The solid content concentration of the photosensitive composition is preferably 3 to 50% by mass and more preferably 20 to 40% by mass.

The viscosity of the photosensitive composition is preferably 1 to 200 mPa·s, more preferably 2 to 100 mPa·s, and most preferably 3 to 80 mPa·s. The viscosity is preferably measured at 25° C.±0.2° C. using, for example, a RE-80L type rotary viscosimeter, manufactured by Toki Sangyo Co., Ltd. At the time of measurement, it is preferable that the rotation rate is 100 rpm at a viscosity of less than 5 mPa·s, 50 rpm at a viscosity of 5 mPa·s or more and less than 10 mPa·s, 20 rpm at a viscosity of 10 mPa·s or more and less than 30 mPa·s, and 10 rpm at a viscosity of 30 mPa·s or more.

Component N: Blocked Isocyanate Compound

The photosensitive composition of the present invention contains a blocked isocyanate compound as Component N. By incorporating Component N into the composition, a cured film having high reliability can be obtained. Although the action mechanism is not clear, it is thought that the block isocyanate group of Component N is deprotected by a heating treatment after photocuring. It is thought that the adhesiveness with a substrate is improved by the action of the isocyanate group derived from Component N in the cured film, or a cured film having high reliability is obtained by the interaction of the isocyanate group, and moisture and salts.

The blocked isocyanate compound is not particularly limited as long as the compound has a block isocyanate group. From the viewpoint of curability, the blocked isocyanate compound is preferably a compound that has two isocyanate groups in one molecule. The upper limit of the number of block isocyanate groups is not particularly limited and is preferably 6 or less.

In addition, the skeleton of the blocked isocyanate compound is not particularly limited and a compound having two isocyanate groups in one molecule is preferable. An aliphatic, alicyclic or aromatic polyisocyanate may be used. For example, isocyanate compound such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethyl hexamethylene diisocyanate, 1,9-nonamethylene diisocyanate, 1,10-decamethylene diisocyanate, 1,4-cyclohexane diisocyanate, 2,2'-diethyl ether diisocyanate, 4,4'-diphenylmethane diisocyanate, o-xylene diisocyanate, m-xylene diisocyanate, p-xylene diisocyanate, methylene bis(cyclohexyl isocyanate), 1,3-dimethylene cyclohexane diisocyanate, 1,4-dimethylene cyclohexane diisocyanate, 1,5-naphthalene diisocyanate, p-phenylene diisocyanate, 3,3'-methylene ditolylene-4,4'-diisocyanate, 4,4'-diphenyl ether diisocyanate, tetrachlorophenylene diisocyanate, norbornane diisocyanate, hydrogenated 1,3-xylylene diisocyanate, and hydrogenated 1,4-xylylene diisocyanate, and polymers thereof, and compounds having a prepolymer skeleton derived from these compounds may be suitably used. Among these, a blocked isocyanate compound in which a compound selected from the group consisting of tolylene diisocyanate (TDI), diphenylmethane diisocyanate (MDI), hexamethylene diisocyanate (HDI), isophorone diisocyanate (IPDI), and polymers thereof is protected is preferable. A blocked isocyanate compound in which a compound selected from the group consisting of hexamethylene diisocyanate, isophorone diisocyanate, and polymers thereof is protected is more preferable.

The polymers of the isocyanate compounds are not particularly limited and as long as the polymer is a dimer or higher polymer. Examples thereof include biurets, isocyanurates, adducts and biurets are preferable.

Parent structures of the blocked isocyanate compounds in the photosensitive composition of the present invention include biurets, isocyanurates, adducts, and difunctional prepolymers.

Blocking agents forming blocked structures of the blocked isocyanate compounds include oxime compounds, lactam compounds, phenol compounds, alcohol compounds, amine compounds, active methylene compounds, pyrazole compounds, mercaptan compounds, imidazole compounds, and imide compounds. Among them, a blocking agent selected from oxime compounds, lactam compounds, phenol compounds, alcohol compounds, amine compounds, active methylene compounds, and pyrazole compounds are preferable, oxime compounds and lactam compounds is more preferable, oxime compounds are still more referable, and methyl ethyl ketone oxime is particularly preferable.

The oxime compounds include oximes and ketoximes, and specific examples thereof include acetoxime, formaldoxime, cyclohexane oxime, methyl ethyl ketone oxime, cyclohexanone oxime, and benzophenone oxime.

Examples of the lactam compounds include ε-caprolactam and γ-butyrolactam.

Examples of the phenol compounds include phenol, naphthol, cresol, xylenol, and halogen-substituted phenol.

Examples of the alcohol compounds include methanol, ethanol, propanol, butanol, cyclohexanol, ethylene glycol monoalkyl ether, propylene glycol monoalkyl ether, and alkyl lactates.

The amine compounds include primary amines and secondary amines, which may be any of aromatic amines, aliphatic amines or alicyclic amines, and examples thereof include aniline, diphenylamine, ethylene imine, and polyethylene imine.

Examples of the active methylene compounds include diethyl malonate, dimethyl malonate, ethyl acetoacetate, and methyl acetoacetate.

Examples of the pyrazole compounds include pyrazole, methylpyrazole, and dimethylpyrazole.

Examples of the mercaptan compounds include alkyl mercaptans and aryl mercaptans.

The blocked isocyanate compounds that can be used in the photosensitive composition of the present invention are commercially available, and examples thereof that can be preferably used include CORONATE AP STABLE M, CORONATE 2503, 2515, 2507, 2513 and 2555, and MILLIONATE MS-50, (all manufactured by Nippon Polyurethane Industry Co., Ltd.), TAKENATE B-830, B-815N, B-820NSU, B-842N, B-846N, B-870N, B-874N and B-882N (all manufactured by Mitsui Chemicals, Inc.), DURANATE 17B-60P, 17B-60PX, 17B-60P, TPA-B80X, TPA-B80E, MF-B60X, MF-B60B, MF-K60X, MF-K60B, E402-B80B, SBN-70D, SBB-70P, and K6000 (all manufactured by Asahi Kasei Chemicals Corp.), and DESMODUR BL1100, BL1265 MPA/X, BL3575/1, BL3272MPA, BL3370MPA, BL3475BA/SN, BL5375MPA, VPLS2078/2, BL4265SN, PL340 and PL350, and SUMIDUR BL3175 (all from Sumika Bayer Urethane Co., Ltd.).

The content of the blocked isocyanate compound in the photosensitive composition of the present invention is preferably 0.1% to 20% by mass, more preferably 0.5% to 10% by mass, and still more preferably 1% to 5% by mass with respect to the total or solid content of the photosensitive composition.

In addition, the content of the blocked isocyanate compound in the photosensitive composition of the present invention is preferably 0.1% to 20% by mass, more preferably 0.5% to 10% y mass, and still more preferably 1% to 5% by mass with respect to the total organic solid content of the photosensitive composition.

When the content of Component N is within the above range, a cured film having high reliability is obtained and thus this case is preferable.

Component K: Polymerization Inhibitor

The photosensitive composition of the present invention contains a polymerization inhibitor as Component K. By incorporating Component K into the composition, a photopolymerization reaction occurring due to light leakage is prevented and excellent developability is obtained. The polymerization inhibitor is a substance which takes the role of conducting hydrogen donation (or hydrogen giving), energy donation (or energy giving), electron donation (or electron giving), or the like with respect to a polymerization initiating radical component generated from a photopolymerization initiator by light exposure or heat, thereby deactivating the polymerization initiating radical and preventing initiation of polymerization. For example, compounds described in paragraphs 0154 to 0173 of JP2007-334322A may be used.

As the type of the polymerization inhibitor, a polymerization inhibitor exhibiting high contrast and not deteriorating sensitivity is preferably adopted. Examples of such a polymerization inhibitor include phenothiazine derivatives such as phenothiazine, chlorpromazine, levomepromazine, fluphenazine, and thioridazine, phenoxazine derivatives such as phenoxazine, 3, 7-bis(diethylamide) phenoxazine-5-ium.perchlorate, 5-amino-9-(dimethylamino)-10-methylbenzo[a]phenoxazine-7-ium.chloride, 7-(pentyloxy)-3H-phenoxazine-3-one, 5,9-diaminobenzo[a]phenoxazine-7-ium.acetate, and 7-ethoxy-3H-phenoxazine-3-one, stable radicals such as tri-p-nitrophenyl methyl, diphenylpicrylhydrazyl, and galvinoxyl, quinones such as quinone, benzoquinone, chloro benzoquinone, 2,5-di-chloro benzoquinone, 2,6-di-chloro benzoquinone, 2,3-di-methyl benzoquinone, 2,5-di-methyl benzoquinone, methoxy benzoquinone, methyl benzoquinone, tetrabromo benzoquinone, tetrachloro benzoquinone, tetramethyl benzoquinone, trichloro benzoquinone, trimethyl benzoquinone, amylquinone, amyloxy hydroquinone, 2,5-di-t-butyl hydroquinone, and 2,5-diphenyl-p-benzoquinone, naphthols such as α-naphthol, 2-nitro-1-naphthol, β-naphthol, and 1-nitro-2-naphthol, phenols such as 4-methoxyphenol, 4-ethoxyphenol, hydroquinone, phenol, t-butylcatechol, methylhydroquinone, n-butylphenol, hydroquinone monopropyl ether, t-butylcresol, p-cresol, 2,6-di-t-butyl-p-cresol, catechol resorcin, o-t-butylphenol, 2,6-di-p-methoxyphenol, 2,6-di-t-butylphenol, 2,4-di-t-butylphenol, 3,5-di-t-butylphenol, 3,5-di-t-butyl-4-hydroxybenzoic acid, N,N'-bis-3-(3',5'-di-t-butyl-4-hydroxyphenyl)propionylhexamethylenediamine, 2,2'-methylene bis(6-t-butyl-p-cresol), n-octadecyl-3-(4-hydroxy-3',5'-di-t-butylphenyl)propionate, distearyl (4-hydroxy-3-methyl-5-t-butyl)benzylmalonate, 2,4,6-tri-t-butylphenol, 1,6-hexanediol-bis[3-(3,5-di-t-butyl-4-hydroxyphenyl) propionate], triethylene glycol-bis[3-(3-t-butyl-5-methyl-4-hydroxyphenyl)propionate], 2,2-thio-diethylene-bis[3-(3,5-di-t-butyl-4-hydroxyphenyl)propionate], 3,9-bis[1,1-dimethyl-2-[β-(3-t-butyl-4-hydroxy-5-methylphenyl)propionyl oxyethyl-2,4,8,10-tetraoxaspiro[5,5]undecane, 2,2'-ethylidene-bis-(2,4-di-t-butyl phenol), 1,1,3-tris-(2-methyl-4-hydroxy-5-t-butylphenylbuthane), 1,3,5-trimethyl-2,4,6-tris(3,5-di-t-butyl-4-hydroxybenzyl)benzene, tris(3,5-di-t-butyl-4-hydroxybenzyl)isocyanate, tris[2-(3',5'-di-t-butyl-4'-hydroxy hydro-cinnamoyloxyl)ethyl]isocyanate, tris(4-t-butyl-2,6-di-methyl-3-hydroxybenzyl)isocyanate, and tetrakis[methylene-3-(3',5'-di-t-butyl-4'-hydroxyphenyl) propionate]-methane, nitrophenol s such as 2,4-dinitrophenol, o-nitrophenol, m-nitrophenol, and p-nitrophenol, gallic acids such as gallic acid, methyl gallate, propyl gallate, and isoamyl gallate, coloring agents such as methylene blue and malachite green, amines such as β-naphthylamine, N-nitroso cyclohexylamine salt, and di-p-fluorophenyl amine, pyrogallol, monobenzyl ether, benzoquinone, triphenylphosphine, copper(I) chloride, phenothiazine, chloranil, pyridine, nitrobenzene, dinitrobenzene, p-toluidine, picric acid, and methyl salicylate.

As the polymerization inhibitor, at least one selected from phenothiazine, phenoxazine, hindered amine, and derivatives thereof is particular preferably exemplified.

Examples of phenothiazine and derivatives thereof include phenothiazine, bis(α-methylbenzyl)phenothiazine, 3, 7-dioctylphenothiazine, and bis(α-dimethylbenzyl)phenothiazine, and phenothiazine is preferable.

Examples of phenoxazine and derivatives thereof include phenoxazine, 3,7-bis(diethylamino) phenoxazine-5-ium.perchlorate, 5-amino-9-(dimethylamino)-10-methylbenzo[a]phenoxazine-7-ium.chloride, 7-(pentyloxy)-3H-phenoxazine-3-one, 5,9-diaminobenzo[a]phenoxazine-7-ium.acetate, and 7-ethoxy-3H-phenoxazine-3-one, and phenoxazine is preferable.

Examples of hindered amine and derivatives thereof include CHIMASSORB 2020 FDL, TINUVIN 144, 765, 770 (all manufactured by BASF GmbH.) and TINUVIN 144 is preferable.

The content of Component K in the photosensitive composition of the present invention is preferably within a range of 0.01% to 0.5% by mass and more preferably within a range of 0.1% to 0.5% by mass with respect to the total solid content of the photosensitive composition. By adjusting the amount of the polymerization inhibitor to be blended, resolution can be improved without deteriorating sensitivity.

The content of Component K in the photosensitive composition of the present invention is preferably within a range of 0.01% to 0.5% by mass and more preferably within a range of 0.05% to 0.5% by mass with respect to the total solid content of the photosensitive composition. By adjusting the amount of the polymerization inhibitor to be blended, resolution can be improved without deteriorating sensitivity.

Component E: Inorganic Particles

The photosensitive composition of the present invention may contain inorganic particles as Component E. By incorporating inorganic particles into the composition, the hardness of a cured film is further improved.

The average particle diameter of the inorganic particles that can be used in the present invention is preferably 1 to 200 nm, more preferably 5 to 100 nm, and most preferably 5 to 50 nm. The average particle diameter refers to an arithmetic average of diameters obtained by measuring diameters of arbitrary 200 particles with an electron microscope. In addition, in the case of particles having a spherical shape, the longest side is set to a diameter.

From the viewpoint of the hardness of a cured film, the void volume of the inorganic particles is preferably less than 10%, more preferably less than 3%, and most preferably zero. The void volume of the particles is an arithmetic average of area ratios between void portions and the entire 200 particles in a cross-sectional image from an electron microscope.

As the inorganic particles, metal oxide particles including atoms of Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, Te, and the like are preferable, silicon oxide, titanium oxide, titanium complex oxide, zinc oxide, zirconium oxide, indium/tin oxide, and antimony/tin oxide are more preferable, silicon oxide, titanium oxide, titanium complex oxide, and zirconium oxide are still more preferable, and silicon oxide or titanium oxide is particularly preferable from the viewpoints of stability of particles, easy availability, the hardness of a cured film, transparency, and refractive index adjustment, and the like.

As silicon oxide, silica is preferable and silica particles are more preferable.

Regarding silica particles, there is no particular problem as long as the particles are particles of an inorganic oxide including silicon dioxide. Particles including silicon dioxide or hydrates thereof as a main component (preferably 80% by mass or more) are preferable. The particles may include aluminate as a minor component (for example, less than 5% by mass). Aluminate that may be included as a minor component includes sodium aluminate and potassium aluminate. In addition, the silica particles may include inorganic salts such as sodium hydroxide, potassium hydroxide, lithium hydroxide, and ammonium hydroxide and organic salts such as tetramethylammonium hydroxide. Examples of these compounds include colloidal silica.

A dispersion medium for colloidal silica is not particularly limited and any of water, organic solvents, and a mixture of these may be used. These may be used alone or as a combination of two or more types thereof.

In the present invention, the particles may be used in the form of dispersion prepared by mixing and dispersing the particles in an appropriate dispersing agent or solvent using a mixing device such as a ball mill or a rod mill. In the photosensitive composition of the present invention, it is not required for colloidal silica to be in a colloidal state.

In the case of blending the inorganic particles, the content of the inorganic particles is preferably 1% by mass or more, more preferably 5% by mass or more, and still more preferably 10% by mass or more with respect to the total solid content of the photosensitive composition from the viewpoint of hardness. Further, the content of the inorganic particles is preferably 80% by mass or less, more preferably 50% by mass or less, still more preferably 40% by mass or less, and particularly preferably 30% by mass or less.

The photosensitive composition may include only one type or two or more types of inorganic particles. In the case in which the photosensitive composition includes two or more types of inorganic particles, the total content thereof is preferably controlled to be within the range.

Component S: Alkoxysilane Compound

It is preferable that the photosensitive composition of the present invention contains an alkoxysilane compound as Component S. When an alkoxysilane compound is used, the adhesiveness between a film formed from the photosensitive composition of the present invention and a substrate can be improved.

The alkoxysilane compound is not particularly limited as long as the compound is a compound having at least one group in which an alkoxy group is directly bonded to a silicon atom. A compound having a dialkoxysilyl group and/or a trialkoxysilyl group is preferable and a compound having a trialkoxysilyl group is more preferable.

As the alkoxysilane compound that can be used in the present invention, a compound for improving the adhesiveness among a substrate, a silicon compound such as for example, silicon, silicon oxide, or silicon nitride, a metal such as gold, copper, molybdenum, titanium, or aluminum, and a cured film is preferable. Specifically, a known silane coupling agent and the like are effective. A silane coupling agent having an ethylenically unsaturated bond is preferable.

Examples of the silane coupling agent include γ-aminopropyl trimethoxysilane, γ-aminopropyl triethoxysilane, γ-glycidoxypropyl trialkoxysilane, γ-glycidoxypropyl dialkoxysilane, γ-methacryloxypropyl trialkoxysilane, γ-methacryloxypropyl dialkoxysilane, γ-chloropropyl trialkoxysilane, γ-mercaptopropyl trialkoxysilane, β-(3,4-epoxycyclohexyl)ethyl trialkoxysilane, and vinyl trialkoxysilane. Among these, γ-methacryloxypropyl trialkoxysilane, γ-acryloxypropyl trialkoxysilane, vinyl trialkoxysilane, and γ-glycidoxypropyl trialkoxysilane are more preferable. These coupling agents may be used alone or as a combination of two or more types thereof.

Examples of a commercially available product include KBM-403 and KBM-5103, manufactured by Shin-Etsu Chemical Co., Ltd.

The content of the alkoxysilane compound in the photosensitive composition of the present invention is preferably 0.1% to 30% by mass, more preferably 2% to 27% by mass, and still more preferably 3% to 24% by mass with respect to the total solid content of the photosensitive composition. The alkoxysilane compound may be used alone or as a combination of two or more types thereof. In the case in which the composition includes two or more types of alkoxysilane compounds, the total content thereof is preferably controlled to be within the range.

(Other Components)

The photosensitive composition of the present invention may contain other components in addition to the above-described components. Examples of other components include compounds having an epoxy group and compounds having an oxetanyl group.

<Compound Having Epoxy Group and Compound Having Oxetanyl Group>

The photosensitive composition of the present invention may include at least one selected from the group consisting of compounds having an epoxy group and compounds having an oxetanyl group. In the above embodiment, the hardness of a cured product to be obtained is further improved.

[Compound Having Epoxy Group]

The photosensitive composition of the present invention may include a compound having an epoxy group. The compound having an epoxy group may have only one epoxy group in a molecule and preferably has two or more epoxy groups.

Specific examples of the compound having two or more epoxy groups in a molecule include bisphenol A type epoxy resin, bisphenol F type epoxy resin, phenol novolak type epoxy resin, cresol novolak type epoxy resin, and aliphatic epoxy resin.

These resins are commercially available. For example, as the bisphenol A type epoxy resin, JER 827, JER 828, JER 834, JER 1001, JER 1002, JER 1003, JER 1055, JER 1007, JER 1009, and JER 1010 (all manufactured by JER Corporation) and EPICLON 860, EPICLON 1050, EPICLON 1051, and EPICLON 1055 (all manufactured by DIC Corporation) are exemplified, as the bisphenol F type epoxy resin, JER 806, JER 807, JER 4004, JER 4005, JER 4007, and JER 4010 (all manufactured by JER Corporation), EPICLON 830 and EPICLON 835 (all manufactured by DIC Corporation), and LCE-21 and RE-6025 (all manufactured by Nippon Kayaku Co., Ltd.) are exemplified, as the phenol novolak type epoxy resin, JER 152, JER 154, JER 157S70, and JER 157S65 (all manufactured by JER Corporation), EPICLON N-740, EPICLON N-740, EPICLON N-770, and EPICLON N-775 (all manufactured by DIC Corporation) are exemplified, as the cresol novolak type epoxy resin, EPICLON N-660, EPICLON N-665, EPICLON N-670, EPICLON N-673, EPICLON N-680, EPICLON N-690, and EPICLON N-695 (all manufactured by DIC Corporation), and EOCN-1020 (all manufactured by Nippon Kayaku Co., Ltd.) are exemplified, and as the aliphatic epoxy resin, ADEKA RESIN EP-40805, EP-40855, and EP-40885 (all manufactured by ADEKA CORPORATION), CELLOXIDE 2021P, CELLOXIDE 2081, CELLOXIDE 2083, CELLOXIDE 2085, EHPE 3150, EPOLEAD PB 3600, and PB 4700 (all manufactured by DAICEL CORPORATION) are exemplified. In addition, ADEKA RESIN EP-40005, EP-4003S, EP-40105, and EP-4011S (all manufactured by ADEKA CORPORATION), NC-2000, NC-3000, NC-7300, XD-1000, EPPN-501, and EPPN-502 (all manufactured by ADEKA CORPORATION) are exemplified.

In addition, urethane compounds having an ethyleneoxide skeleton described in JP1983-49860B (JP-S58-49860B), JP1981-17654B (JP-S56-17654B), JP1987-39417B (JP-S62-39417B), and JP1987-39418B (JP-S62-39418B) may be also suitably used and the contents of these are incorporated in the present specification.

In the case in which the photosensitive composition of the present invention includes a compound having an epoxy group, the content of the compound having an epoxy group is preferably within a range of 0.1% to 20% by mass, more preferably within a range of 0.5% to 10% by mass, and still more preferably within a range of 1% to 5% by mass with respect to the total solid content of the composition.

The photosensitive composition of the present invention may include one type or two or more types thereof of compounds having an epoxy group. In the case in which the photosensitive composition includes two or more types thereof of compounds, the total amount thereof is preferably controlled to be within the above range.

[Compound Having Oxetanyl Group]

The photosensitive composition of the present invention may include a compound having an oxetanyl group. The compound having an oxetanyl group may have only one type of oxetanyl group in a molecule and preferably has two or more types of oxetanyl groups.

Specific examples of the compound having an oxetanyl group that may be used include ARON OXETANE OXT-121, OXT-221, OX-SQ, and PNOX (all manufactured by Toagosei Co., Ltd.).

In addition, it is preferable that the compound having an oxetanyl group is used alone or as a mixture with a compound having an epoxy group.

In the case in which the photosensitive composition of the present invention includes the compound having an oxetanyl group, the content of the compound having an oxetanyl group is preferably within a range of 0.1% to 20% by mass, more preferably within a range of 0.5% to 10% by mass, and still more preferably within a range of 1% to 5% by mass with respect to the total solid content of the composition.

The photosensitive composition of the present invention may include only one type or two or more types of compounds having an oxetanyl group. In the case in which the photosensitive composition includes two or more types of compounds, the total amount thereof is preferably controlled to be within the above range.

The photosensitive composition of the present invention may include other components (for example, a compound having an alkoxymethyl group) within a range not departing from the gist of the present invention in addition to the above-described components. Examples of a compound having an alkoxymethyl group include compounds described in paragraphs 0192 to 0194 of JP2011-221494A.

<Surfactant>

The photosensitive composition of the present invention may contain a surfactant as other components.

As the surfactant, anionic, cationic, nonionic or amphoteric surfactants may be used but nonionic surfactants are preferable. As the surfactant, nonionic surfactants are preferable and fluorine-based surfactants are more preferable.

Examples of commercially available products of the surfactant that can be used in the present invention include MEGAFAC F142D, F172, F173, F176, F177, F183, F479, F482, F554, F780, F781, F781-F, R30, R08, F-472SF, BL20, R-61, and R-90 (manufactured by DIC Corporation), FLUORAD FC-135, FC-170C, FC-430, FC-431, and Novec FC-4430 (manufactured by Sumitomo 3M Limited), ASAHI GUARD AG7105, 7000, 950, and 7600, Surfluon S-112, S-113, S-131, S-141, S-145, S-382, SC-101, SC-102, SC-103, SC-104, SC-105, and SC-106 (manufactured by Asahi Glass Co., Ltd.), EFTOP EF351, 352, 801, and 802 (manufactured by Mitsubishi Materials Electronic Chemicals Co., Ltd.), and FTERGENT 250 (manufactured by Neos Company Limited). In addition, examples other than the above include KP (manufactured by Shin-Etsu Chemical Co., Ltd.), POLYFLOW (manufactured by Kyoeisha Chemical Co., Ltd.), EFTOP (Mitsubishi Materials Electronic Chemicals Co., Ltd.), MEGAFAC (manufactured by DIC Corporation), FLUORAD (manufactured by Sumitomo 3M Limited), ASAHIGUARD and SURFLON (manufactured by Asahi Glass Co., Ltd.), and POLYFOX (manufactured by OMNOVA) series.

In addition, a preferable example of the surfactant include a copolymer including a constitutional unit A and a constitutional unit B represented by Formula W below, whose weight-average molecular weight (Mw) in terms of polystyrene measured by gel permeation chromatography using tetrahydrofuran as a solvent is 1,000 or more and 10,000 or less.

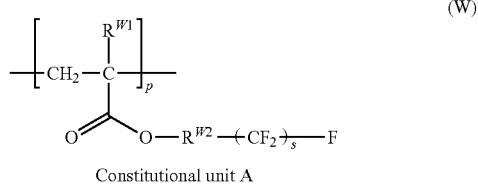

(W)

Constitutional unit A

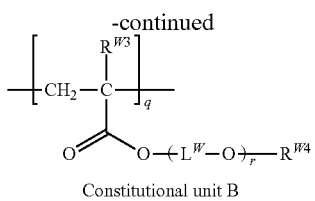

Constitutional unit B

In Formula W, $R^{W1}$ and $R^{W3}$ each independently represent a hydrogen atom or a methyl group, $R^{W2}$ represents a linear alkyl group having 1 to 4 carbon atoms, $R^{W4}$ represents a hydrogen atom or an alkyl group having 1 to 4 carbon atoms, $L^W$ represents an alkylene group having 3 to 6 carbon atoms, p and q represent a mass percentage indicating a weight ratio, p represents a numerical value of 10% by mass or more and 80% by mass or less, q represents a numerical value of 20% by mass or more and 90% by mass or less, r represents an integer of 1 or more and 18 or less, and s represents an integer of 1 or more and 10 or less.

It is preferable that $L^W$ is a branched alkylene group represented by Formula W-2 below. $R^{W5}$ in Formula W-2 represents an alkyl group having 1 to 4 carbon atoms, and is preferably an alkyl group having 1 to 3 carbon atoms and more preferably an alkyl group having 2 or 3 carbon atoms from the viewpoint of compatibility and wettability with respect to a surface to be coated.

It is preferable that the sum (p+q) of p and q in Formula W is p+q=100, that is, 100% by mass.

The weight-average molecular weight (Mw) of the copolymer is more preferably 1,500 or more and 5,000 or less.

(W-2)

The content of the surfactant in the photosensitive composition of the present invention is preferably 0.001% to 5.0% by mass and more preferably 0.01% to 2.0% by mass with respect to the total solid content of the composition in the case in which the surfactant is added.

The surfactant may be used alone or as a combination of two or more types thereof. In the case in which the photosensitive composition includes two or more types of surfactants, the total amount thereof is preferably controlled to be within the above range.

<Antioxidant>

The photosensitive composition of the present invention may contain an antioxidant in addition to the above-described components. The antioxidant is a compound other than Component K described above. As the antioxidant, the composition may contain a known antioxidant. By adding the antioxidant, coloration of a cured film can be prevented or a decrease in film thickness caused by decomposition can be reduced. Thus, there is an advantage that heat resistant transparency is excellent.

Examples of such an antioxidant include phosphorus-based antioxidants, amides, hydrazides, hindered phenolic antioxidants, ascorbic acids, zinc sulfate, saccharides, nitrites, sulfites, thiosulfates, and hydroxylamine derivatives. Among these, from the viewpoint of coloration of a cured film and a reduction in film thickness, hindered phenolic antioxidants and phosphorus-based antioxidants are preferable and hindered phenolic antioxidants are most preferable. The antioxidants may be used alone or as a mixture of two or more types thereof.

Preferable commercially available products include ADK STAB AO-60 and ADK STAB AO-80 (all manufactured by ADEKA CORPORATION), and IRGANOX 1098 (all manufactured by BASF GmbH.).

The content of the antioxidant is not particularly limited and is preferably 0.1% to 10% by mass, more preferably 0.2% to 5% by mass, and still more preferably 0.5% to 4% by mass with respect to the total solid content of the photosensitive composition.

<Binder Polymer>

The photosensitive composition of the present invention may contain a binder polymer from the viewpoint of improvement of resolution and film characteristics.

The binder polymer is not particularly limited and a known binder polymer may be used. A liner organic polymer is preferably used. As such a liner organic polymer, a known binder polymer may be optionally used. Preferably, in order to make development with water or development with weakly alkaline water possible, a linear organic polymer soluble or swellable in water or weakly alkaline water is selected. The liner organic polymer may not only be used as a film forming agent but may also be appropriately selected according to the intended application with water, weakly alkaline water, or organic solvent developer. For example, when a water soluble organic polymer is used, development with water becomes possible. Examples of such a linear organic polymer include a radical polymer containing a carboxylic acid group in a side chain such as those described in JP1984-44615A (JP-S59-44615A), JP1979-34327B (JP-S54-34327B), JP1980-12577B (JP-S58-12577B), JP1979-25957B (JP-S54-25957B), JP1979-92723B (JP-S54-92723B), JP1984-53836B (JP-S59-53836B), and JP1984-71048B (JP-S59-71048B), that is, a resin formed by homopolymerization or copolymerization of a monomer containing a carboxyl group, a resin formed by hydrolysis, half-esterification, or half-amidation of an acid anhydride unit of a homopolymer or copolymer of an acid anhydride containing monomer, and an epoxyacrylate formed by modifying an epoxy resin with an unsaturated monocarboxylic acid or acid anhydride. Examples of the monomer containing a carboxyl group include acrylic acid, methacrylic acid, itaconic acid, crotonic acid, maleic acid, fumaric acid, and 4-carboxylstyrene. Examples of the monomer containing an acid anhydride include maleic anhydride.

Similarly, examples include an acidic cellulose derivative containing a carboxylic acid group in a side chain. Other than the above, one formed by adding a cyclic acid anhydride to a polymer containing a hydroxy group is also useful.

The content of the binder polymer in the photosensitive composition of the present invention is not particularly limited and is preferably 0% to 40% by mass, more preferably 0% to 30% by mass, still more preferably 0% to 20% by mass, particularly preferably 0% to 10% by mass, and most preferably 0% to 5% by mass with respect to the total solid content of the photosensitive composition.

In the photosensitive composition of the present invention, the content of the polymer component having a weight-average molecular weight of more than 10,000 is preferably 0% to 40% by mass, more preferably 0% to 30% by mass, still more preferably 0% to 20% by mass, particularly preferably 0% to 10% by mass, and most preferably 0% to 5% by mass with respect to the total solid content of the photosensitive composition.

When the content of the polymer component is within the above range, developability and curability are excellent.

[Other Component]

To the photosensitive composition of the present invention, if required, the above-described components, other components such as a plasticizer, a thermal acid generating agent, and an acid increasing agent, may be added. As these components, described in, for example, JP2009-98616A and JP2009-244801A, and other components may be used. In addition, various ultraviolet absorbents, metal inactivators and the like described in "New Development of Polymer Additives (Nikkan Kogyo Shimbun, Ltd.)" may also be added to the photosensitive composition of the present invention.

<Composition of Photosensitive Composition>

It is preferable that the photosensitive composition of the present invention contains Component A in an amount of 3% to 49.5% by mass, Component B in an amount of 20% to 85% by mass, Component C in an amount of 0.5% to 30% by mass, Component N in an amount of 0.1% to 20% by mass, and Component K in an amount of 0.01% to 0.5% by mass with respect to the total organic solid content of the photosensitive composition.

<Cured Film, Cured Product and Production Method Thereof>

A cured product of the present invention is a cured product obtained by curing the photosensitive composition of the present invention. The cured product is preferably a cured film. In addition, the cured film of the present invention is preferably a cured film obtained by the method for producing a cured film of the present invention.

The method for producing a cured film of the present invention is not particularly limited as long as the method is a method for producing a cured film by curing the photosensitive composition of the present invention but preferably includes the following steps 1 to 5 in this order.

Step 1: Application step of applying the photosensitive composition of the present invention to a substrate Step 2: Solvent removing step of removing a solvent from the applied photosensitive composition Step 3: Exposure step of exposing at least a part of the photosensitive composition from which a solvent is removed to actinic rays Step 4: Development step of developing the exposed photosensitive composition with an aqueous developer Step 5: Heat treatment step of carrying out a heat treatment on the developed photosensitive composition In addition, it is more preferable that the method for producing a cured film of the present invention includes the following step 4' after the above step 4 and before the step 5.

Step 4': Step of further irradiating the developed photosensitive composition with actinic rays In the application step, it is preferable that the photosensitive composition of the present invention is applied to a substrate to form a wet film including a solvent. Before the photosensitive composition is applied to the substrate, the substrate may be subjected to washing such as alkali washing and plasma washing. Further, after the substrate is cleaned, the surface of the substrate may be treated with hexyl methyl disilazane or the like. By carrying out this treatment, the adhesiveness of the photosensitive composition to the substrate tends to be improved.

As the substrate, substrates of an inorganic material, resin, resin composite material, and the like may be used.

Examples of the inorganic substrate include substrates of glass, quartz, silicon, silicon nitride, and a composite substrate formed by vapor deposition of molybdenum, titanium, aluminum, copper, or the like on such a substrate.

Examples of the resin include substrates of synthetic resins such as polybutylene terephthalate, polyethylene terephthalate, polyethylene naphthalate, polybutylene naphthalate, polystyrene, polycarbonate, polysulfone, polyether sulfone, polyarylate, allyldiglycolcarbonate, polyamide, polyimide, polyamide imide, polyether imide, polybenzazole, polyphenylene sulfide, polycycloolefine, norbornene resin, a fluorine resin such as polychlorotrifluoroethylene, a liquid crystal polymer, an acrylic resin, an epoxy resin, a silicone resin, an ionomer resin, a cyanate resin, a cross-linked fumaric acid diester, a cyclic polyolefine, an aromatic ether, a maleimide-olefin copolymer, cellulose, and an episulfide resin.

These substrates are rarely used in its configuration and are usually formed into a multilayer structure such as for example in a TFT element according to the configuration of the final product.

In addition, in the case of a touch panel having an ON-cell structure or the like, the photosensitive composition of the present invention may be applied to LCD cells or OLED cells that are once completed as a panel.

Since good adhesion to a metal film formed by sputtering and a metal oxide is obtained, the photosensitive composition of the present invention preferably include a metal film formed by sputtering as the substrate. As the metal, titanium, copper, aluminum, indium, tin, manganese, nickel, cobalt, molybdenum, tungsten, chromium, silver, neodymium, and oxides or alloys thereof are preferable and molybdenum, titanium, aluminum, copper and alloys thereof are more preferable. The metal and metal oxide may be used alone or plural types thereof may be used in combination.

The coating method of the substrate is not particularly limited and for example, an inkjet method, a slit coating method, a spray method, a roll coating method, spin coating method, cast coating method, a slit-and-spin method, a printing method, and the like may be used.

In the solvent removing step, it is preferable that the solvent is removed from the applied film in reduced pressure (vacuum) and/or by heating to form a dried coating film on the substrate. The heating of the solvent removing step is preferably carried out under the condition of a temperature of 70° C. to 130° C. for about 30 to 300 seconds. In addition, in the solvent removing step, the solvent in the photosensitive composition is not necessarily completely removed and at least some of the solvent may be removed.

In the exposure step, it is preferable that the obtained coating film is irradiated with actinic rays at a wavelength of 300 nm or more and 450 nm or less to form a predetermined pattern. In this step, the polymerizable monomer is polymerized and cured by the action of the photopolymerization initiator.

As an exposure light source, a low pressure mercury lamp, a high pressure mercury lamp, an ultra high pressure mercury lamp, a chemical lamp, an LED light source, an excimer laser generator, and the like may be used, and actinic rays having a wavelength of 300 nm or more and 450 nm or less, such as i-ray (365 nm), h-ray (405 nm), or g-ray (436 nm), may be preferably used. The irradiation light may be adjusted, if required, by way of a spectral filter such as a long wavelength cut filter, a short wavelength cut filter, or a band-pass filter.

As the exposure device, various types of exposure devices such as a mirror projection aligner, a stepper, a scanner, proximity, contact, a microlens array, a lens scanner, and laser exposure may be used.

The amount of exposure in the exposure step is not particularly limited and is preferably 1 to 3,000 mJ/cm² and more preferably 1 to 500 mJ/cm².

Exposure in the exposure step is preferably carried out in a state in which oxygen is blocked from the viewpoint of promoting curing. Examples of means for blocking oxygen include exposing under an atmosphere of nitrogen and providing an oxygen barrier film.

In addition, exposure in the exposure step may be carried out on at least a part of the curable composition from which the solvent is removed and may be, for example, whole surface exposure or pattern exposure. In the present invention, the exposure step is preferably a step of carrying out pattern exposure and more preferably a step of carrying out exposure via a photomask.

Further, it is possible to carry out, after the exposure step, a post-exposure heating treatment: Post Exposure Bake (hereinafter, also referred to as "PEB"). The temperature in the case of carrying out PEB is preferably 30° C. or higher and 130° C. or lower, more preferably 40° C. or higher and 120° C. or lower, and particularly preferably 50° C. or higher and 110° C. or lower.

The heating method is not particularly limited, and a known method may be used. Examples include a hotplate, an oven, and an infrared heater.

The heating time is preferably about 1 minute to 30 minutes in the case of a hotplate, and preferably about 20 minutes to 120 minutes in other cases. With this range, it is possible to carry out heating without damaging the substrate or the device.

In the development step, a uncured portion of the photosensitive composition that has been patternwise exposed is developed and removed using an aqueous developer to thus form a negative image. The developer used in the development step is preferably an alkaline aqueous developer.

The developer used in the development step is preferably an aqueous solution of a basic compound. As the basic compound, for example, alkali metal hydroxides such as lithium hydroxide, sodium hydroxide, and potassium hydroxide; alkali metal carbonates such as sodium carbonate, potassium carbonate, and cesium carbonate; alkali metal bicarbonates such as sodium bicarbonate and potassium bicarbonate; tetraalkyl ammonium hydroxides such as tetramethyl ammonium hydroxide, tetraethyl ammonium hydroxide, tetrapropyl ammonium hydroxide, tetrabutyl ammonium hydroxide, and diethyldimethyl ammonium hydroxide; (hydroxyalkyl) trialkyl ammonium hydroxides such as choline; silicates such as sodium silicate and sodium metasilicate; alkyl amines such as ethylamine, propylamine, diethylamine, and triethylamine; alcohol amines such as dimethylethanol amine and triethanol amine; and alcyclic amines such as 1,8-diazabicyclo[5.4.0]-7-undecene, and 1,5-diazabicyclo[4.3.0]-5-nonene may be used.

Among these, sodium hydroxide, potassium hydroxide, tetramethyl ammonium hydroxide, tetraethyl ammonium hydroxide, tetrapropyl ammonium hydroxide, tetrabutyl ammonium hydroxide, choline(2-hydroxyethyltrimethyl ammonium hydroxide) are preferable.

It is also possible to use an aqueous solution obtained by adding an appropriate amount of a water soluble organic solvent such as methanol or ethanol or a surfactant to the above aqueous solution of an alkali as the developer.

Preferable examples of the developer include a 0.4% to 2.5% by mass aqueous solution of tetramethyl ammonium hydroxide.

The pH of the developer is preferably 10.0 to 14.0.

The development time is preferably 30 to 500 seconds, and the method for development may be any of a liquid puddle method (puddle method), a shower method, and a dip method.

A rinsing step may be carried out after development. In the rinsing step, removal of attached developer and removal of development residue are carried out by washing the substrate with pure water or the like after development. As a rinsing method, a known method may be used. Examples thereof include shower rinsing and dip rinsing.

With regard to pattern exposure and development, a known method and a known developer may be used. For example, the pattern exposure method and the development method described in JP2011-186398A and JP2013-83937A may suitably be used.

In addition, it is preferable that the production method include a step of further irradiating the developed photosensitive composition with actinic rays (post-exposure) after the development step and before the heat treatment step, from the viewpoint of improving film hardness.

In this case, it is preferable that exposure is carried out using a mercury lamp or an LED lamp with energy having an intensity of about 50 to 3,000 mJ/cm². In addition, the post-exposure is preferably whole surface exposure.

By carrying out the post-exposure, the curing reaction of the film may be further promoted and thus the film hardness is improved.

It is preferable that the method for producing a cured film of the present invention includes a step of carrying out a heat treatment on the developed photosensitive composition after the development step (post-bake). When the photosensitive composition of the present invention is developed and then a heat treatment is carried out, a cured film having more excellent strength may be obtained.

The temperature in the heat treatment is preferably 180° C. or lower, more preferably 150° C. or lower, and still more preferably 130° C. or less. The lower limit is preferably 80° C. or higher and more preferably 90° C. or higher. The heating method is not particularly limited and a known method may be used. For example, a hotplate, an oven, or an infrared heater may be used.

In addition, the heating time is preferably about 1 minute to 30 minutes in the case of a hotplate, and preferably about 20 minutes to 120 minutes in other cases. With this range, it is possible to carry out heating without damaging the substrate or the device.

Further, curing by means of light and/or heat in the method for producing a cured film of the present invention may be carried out continuously or in succession.

When a heat treatment is carried out, the transparency may be improved by carrying it out under an atmosphere of nitrogen.

From the viewpoint of shape adjustment after heating, a heat treatment step may also be carried out after carrying out baking at a relatively low temperature before the heating treatment (post-bake) (addition of a middle-bake step). For example, a method of first carrying out heating at 90° C. for 30 minutes (middle bake) and then carrying out heating at 120° C. for 30 minutes (post-bake) and the like may be used. In addition, it is also possible to carry out middle-bake and post-bake heating in multiple stages of three or more stages in a divided manner. Designing the middle-bake and post-bake in this manner enables the taper angle of a pattern to be adjusted. The above heating may be carried out by using a known heating method such as a hotplate, an oven, or an infrared heater.

The cured film of the present invention is a cured film obtained by curing the photosensitive composition of the present invention.

The cured film of the present invention may be suitably used as an over coat film (protective film) or an interlayer insulation film. In addition, the cured film of the present invention is preferably a cured film obtained by the method for producing a cured film of the present invention.

From the photosensitive composition of the present invention, a cured film having hardness sufficient for curing at a low temperature is obtained. For example, a cured film whose pencil hardness measured according to JIS K5600: 1999 with a load of 750 g is 2H or more is obtained. A protective film formed by curing the photosensitive composition of the present invention has excellent cured film physical properties, the film is useful for a touch panel, a touch panel display device, an organic EL display device, a liquid crystal display device, or the like.

Since the photosensitive composition of the present invention has excellent curability and cured film physical properties, the photosensitive composition is used as structural members for a MEMS device by using a cured product formed by curing the photosensitive composition of the present invention or a resist pattern as partition wall, or incorporating the photosensitive composition as a part of a machine driving component. Examples of such a MEMS device include components such as a SAW filter, a BAW filter, a gyro sensor, a display microshutter, an image sensor, electronic paper, an inkjet head, a biochip, a sealing agent, and the like. More specific examples are shown in JP2007-522531A, JP2008-250200A, and JP2009-263544A.

Figure 2:
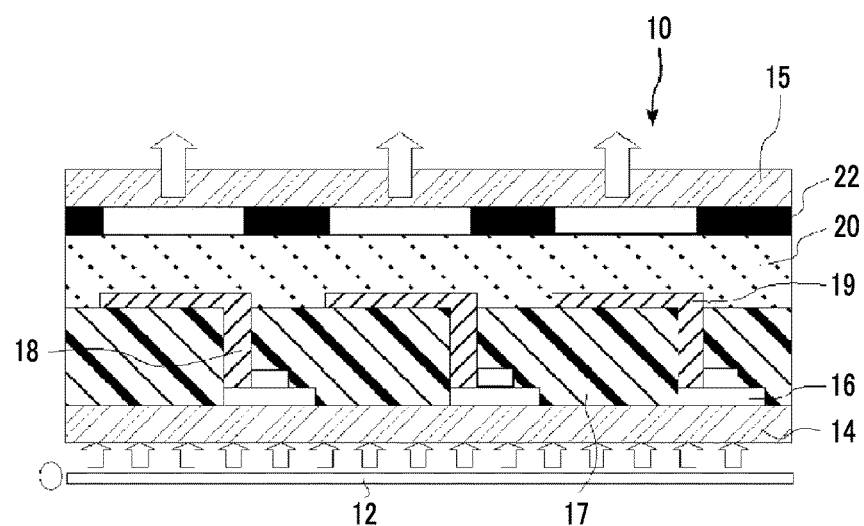
FIG. 2 is a schematic configuration view showing an example of a liquid crystal display device.
Figure 3:
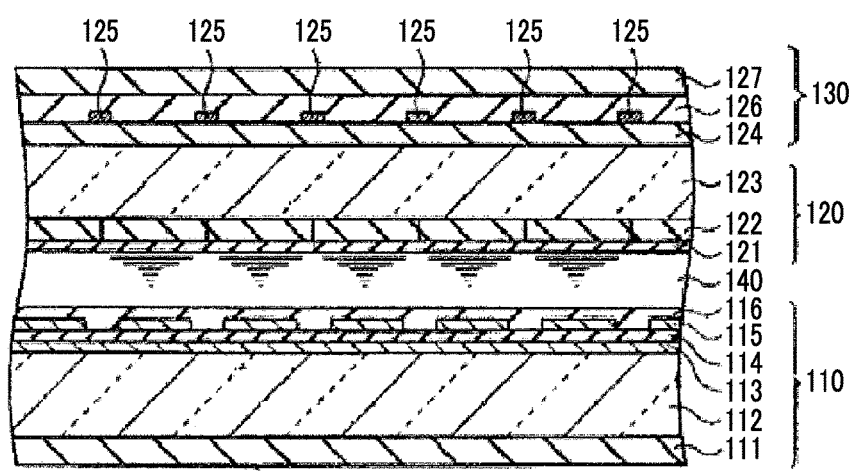
FIG. 3 is a schematic configuration view showing an example of a liquid crystal display device having a function of a touch panel.

Since the photosensitive composition of the present invention has excellent flatness and transparency, the photosensitive composition may be used for forming, for example, a bank layer (16) and a flattened film (57) shown in FIG. 2 of JP2011-107476A, a partition wall (12) and a flattened film (102) shown in FIG. 4A of JP2010-9793A, a bank layer (221) and a third interlayer insulation film (216*b*) shown in FIG. 10 of JP2010-27591A, a second interlayer insulation film (125) and a third interlayer insulation film (126) shown in FIG. 4A of JP2009-128577A, a flattened film (12) and a pixel separation insulation film (14) shown in FIG. 3 of JP2010-182638A, and the like. In addition, the photosensitive composition may be suitably used for a spacer for keeping the thickness of a liquid crystal layer in a liquid crystal display device constant, a color filter of a liquid crystal display device, a color filter protective film, a facsimile, an electronic copying machine, an optical image forming system of an on-chip color filter such as a solid-state imaging element, or a microlens of an optical fiber connector.

<Organic EL Display Device>

An organic EL display device of the present invention has the cured film of the present invention.

The organic EL display device of the present invention is not particularly limited except that the organic EL display device has a flattened film or an interlayer insulation film that is formed by using the photosensitive composition of the present invention. Various known organic EL display devices and liquid crystal display devices adopting various structures may be used.

For example, specific examples of a thin-film transistor (TFT) of the organic EL display device of the present invention include an amorphous silicon-TFT, a low temperature polysilicon TFT, and an oxide semiconductor TFT. Since the cured film of the present invention has excellent electrical characteristics, the cured film may be preferably used by being incorporated into these TFTs.

FIG. 1 is a schematic configuration view showing an example of an organic EL display device. FIG. 1 is a schematic cross-sectional view showing a substrate of a bottom emission type organic EL display device and a flattened film 4 is provided.

A bottom gate type TFT 1 is formed on a glass substrate 6, and an insulation film 3 made of $Si_3N_4$ is formed in a state in which the insulation film covers the TFT 1. A contact hole (not shown) is formed in the insulation film 3 and then a wiring 2 (having a height of 1.0 µm) which is connected to the TFT 1 via the contact hole is formed on the insulation film 3. The wiring 2 is provided to connect the TFTs 1 or an organic EL element which is to be formed in the subsequent step, and the TFT 1.

Further, in order to flatten roughness resulting from the formation of the wiring 2, a flattened film 4 is formed on the insulation film 3 in a state in which roughness resulting from the wiring 2 is embedded.

A bottom emission type organic EL element is formed on the flattened film 4. That is, a first electrode 5 made of ITO is formed on the flattened film 4 to be connected to the wiring 2 via the contact hole 7. In addition, the first electrode 5 corresponds to an anode of an organic EL element.

An insulation film 8 is formed so as to cover the edge of the first electrode 5 and providing the insulating film 8 enables a short circuit between the first electrode 5 and a second electrode formed in a subsequent step to be prevented.

Moreover, although not shown in FIG. 1, a positive hole transport layer, an organic light emitting layer, and an electron transport layer may be provided in sequence by vapor deposition via desired pattern masks, a second electrode made of Al is then formed on the entire upper surface of the substrate, and sealing with a sealing glass plate is carried out using an ultraviolet curing type epoxy resin by lamination, thus obtaining an active matrix type organic EL display device in which a TFT 1 is connected to each organic EL element in order to drive the elements.

<Liquid Crystal Display Device>

A liquid crystal display device of the present invention has the cured film of the present invention.

The liquid crystal display device of the present invention is not particularly limited except that the liquid crystal display device has a protective film, a flattened film or an interlayer insulation film that is formed using the photosensitive composition of the present invention and known liquid crystal display devices adopting various structures may be used.

Examples of a liquid crystal driving mode that can be adopted by the liquid crystal display device of the present invention include a twisted nematic (TN) mode, a vertical alignment (VA) mode, an in-plane-switching (IPS) mode, and a fringe field switching (FFS) mode, an optically compensated bend (OCB) mode.

Regarding the panel configuration, even in a color filter on array (COA) mode liquid crystal display device, the cured film of the present invention may be used. For example, the cured film may be used as an organic insulation film (115) of JP2005-284291A and in organic insulation film (212) of JP2005-346054A. In addition, the specific alignment mode of a liquid crystal alignment layer that can be adopted by the liquid crystal display device of the present invention includes a rubbing alignment method and a photoalignment method. Further, polymer alignment support may be achieved by the polymer sustained alignment (PSA) technology described in JP2003-149647A and JP2011-257734A.

In addition, the photosensitive composition of the present invention and the cured film of the present invention are not limited to the above applications and may be used for various applications. For example, the photosensitive composition and the cured film may be suitably used for, in addition to a flattened film or an interlayer insulation film, a protective film, a spacer for keeping the thickness of a liquid crystal layer in a liquid crystal display device constant, or a microlens provided on a color filter in a solid-state imaging element.

FIG. 2 is a schematic configuration view showing an example of an active matrix type liquid crystal display device 10. The color liquid crystal display device 10 is a panel having a backlight unit 12 on the rear surface thereof and in the liquid crystal panel, elements of TFTs 16 corresponding to all pixels that are disposed between two glass substrates 14 and 15 to which a polarizing film is attached are disposed. An ITO transparent electrode 19 forming a pixel electrode is wired to each element formed on the glass substrate via a contact hole 18 formed in a cured film 17. A liquid crystal 20 layer and an RGB color filter 22 having a black matrix disposed thereon are provided on the ITO transparent electrode 19.

The light source of the backlight is not particularly limited and a known light source may be used. For example, white light, LEDs, multicolor LEDs of blue light, red light, and green light, fluorescent light (cold cathode tube), organic ELs, and the like may be used.

In addition, the liquid crystal display device can employ a liquid crystal display device of 3D (stereoscopic) type or touch panel type. Further, a liquid crystal display device of flexible type can be also employed. The liquid crystal display device may be used as a second interlayer insulation film (48) described in JP2011-145686A and an interlayer insulation film (520) described in JP2009-258758A.

<Touch Panel and Touch Panel Display Device>

A touch panel of the present invention is a touch panel in which the entity or a part of an insulating layer and/or a protective layer is made of a cured product of the curable composition of the present invention. It is preferable that the touch panel of the present invention at least has a transparent substrate, an electrode, an insulating layer and/or a protective layer.

It is preferable that a touch panel display device of the present invention is a touch panel display device having the touch panel of the present invention. The touch panel of the present invention may employ a panel of known type such as resistive film type, electrostatic capacity type, ultrasonic type or infrared type. Among these, a panel of electrostatic capacity type is preferable.

Examples of the touch panel of electrostatic capacity type include touch panels described in JP2010-28115A and disclosed in WO 2012/057165. Other types of touch panels include touch panels of so-called, in-cell type (for example, refer to FIGS. 5, 6, 7 and 8 of JP2012-517051A), so-called, on-cell type (for example, refer to FIG. 14 of JP2012-43394A and FIG. 2B of WO 2012/141148) OGS type, TOL type, and other configurations (for example, refer to FIG. 6 of JP2013-164871A).

In addition, FIG. 3 is a schematic configuration view showing an example of a liquid crystal display device having a function of a touch panel.

For example, the cured film of the present invention is suitably used for a protective film between each layer in FIG. 3 and also suitably applied to an interlayer insulation film for separating detection electrodes of the touch panel. The detection electrode of the touch panel is preferably made of silver, copper, aluminum, titanium, molybdenum, and alloys thereof.

In FIG. 3, the reference numeral 110 represents a pixel substrate, the reference numeral 140 represents a liquid crystal layer, the reference numeral 120 represents a counter substrate, and the reference numeral 130 represents a sensor portion, respectively. The pixel substrate 110 has a polarizing plate 111, a transparent substrate 112, a common electrode 113, an insulating layer 114, a pixel electrode 115, and an alignment layer 116 sequentially from the lower side in FIG. 3. The counter substrate 120 has an alignment layer 121, a color filter 122, and a transparent substrate 123 sequentially from the lower side in FIG. 3. The sensor portion 130 respectively has a phase difference film 124, an adhesive layer 126, and a polarizing plate 127. In addition, in FIG. 3, the reference numeral 125 represents a sensor detection electrode. The cured film of present invention may be used for the insulating layer (114) (also referred to the interlayer insulation film) of the pixel substrate portion and various protective films (not shown), various protective films (not shown) of the pixel substrate portion, various protective films (not shown) of the counter substrate portion, various protective films (not shown) of the sensor portion, and the like.

Further, a pattern having high designability can be displayed in a liquid crystal display device of a static driving system by applying the present invention. For example, the present invention may be applied as an insulation film of a polymer network type liquid crystal described in JP2001-125086A.

Figure 4:
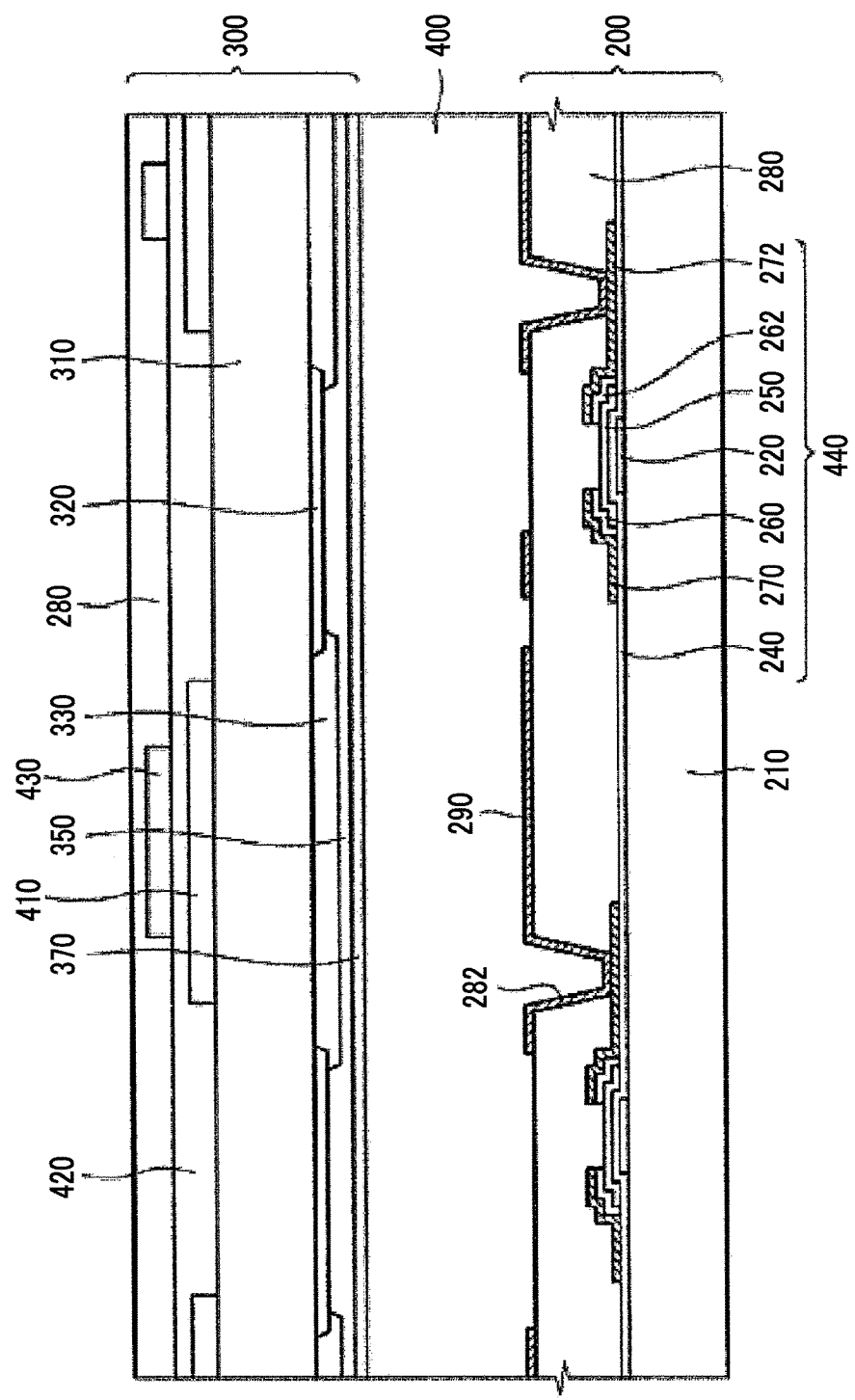
FIG. 4 is a schematic configuration view showing another example of the liquid crystal display device having a function of a touch panel.

In addition, FIG. 4 is a schematic configuration view showing another example of the liquid crystal display device having a function of a touch panel.

The liquid crystal display device includes a lower display panel 200 corresponding to a thin film transistor display panel provided with a thin film transistor (TFT) 440 and a upper display panel 300 facing the lower display panel 200 and corresponding to a color filter display panel provided with plural color filters 330 disposed on the surface facing the lower display panel 200, and a liquid crystal layer 400 formed between the lower display panel 200 and the upper display panel 300. The liquid crystal layer 400 includes liquid crystal molecules (not shown).

The lower display panel 200 includes a first insulating substrate 210, a thin film transistor (TFT) that is disposed on the first insulating substrate 210, an insulation film 280 that is formed on the upper surface of the thin film transistor (TFT), and a pixel electrode 290 that is disposed on the insulation film 280. The thin film transistor (TFT) includes a gate electrode 220, a gate insulation film 240 that covers the gate electrode 220, a semiconductor layer 250, ohmic contact layers 260 and 262, a source electrode 270, and a drain electrode 272.

In the insulation film 280, a contact hole 282 is formed such that the drain electrode 272 of the thin film transistor (TFT) is exposed.

The upper display panel 300 includes a light blocking member 320 that is disposed on one surface of a second insulating substrate 310 and arranged in a matrix shape, an alignment layer 350 that is disposed on the second insulating substrate 310, a color filter 330 that is disposed on the alignment layer 350, and a common electrode 370 that is arranged on the color filter 330, corresponds to the pixel electrode 290 of the lower display panel 200 to apply voltage to the liquid crystal layer 400.

In the liquid crystal display device shown in FIG. 4, a sensing electrode 410, an insulation film 420, a driving film 430, and a protective film 280 are disposed on the other surface of the second insulating substrate 310. In the production of the liquid crystal display device shown in FIG. 4 as described above, when the upper display panel 300 is formed, a sensing electrode 410, an insulation film 420, a driving film 430, and the like, which are constitutional requirements for a touch screen, may be formed together. Particularly, the cured film formed by curing the photosensitive composition of the present invention may be suitably used for the insulation film 280 or the insulation film 420.

EXAMPLES

The present invention will be further specifically described by reference to the following Examples. The materials, amount of material used, proportions, processing details, treatment procedure, and the like shown in the Examples below may be modified as appropriate as long as the modifications do not depart from the spirit and scope of the present invention. Therefore, the scope of the present invention should not be construed as being limited to the specific Examples shown below. In addition, "parts" and "%" are on a mass basis unless otherwise specified.

Each component used in Examples and Comparative Examples is as follows.

(Component A)
a-1: Compound having the following structure
a-2: Compound having the following structure
a-3: Compound having the following structure
a'-1: ARONIX M-5300 (manufactured by Toagosei Co., Ltd.), 1-functional

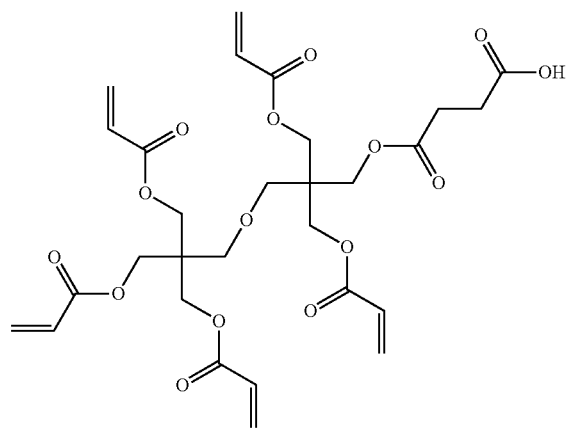

(a-1)

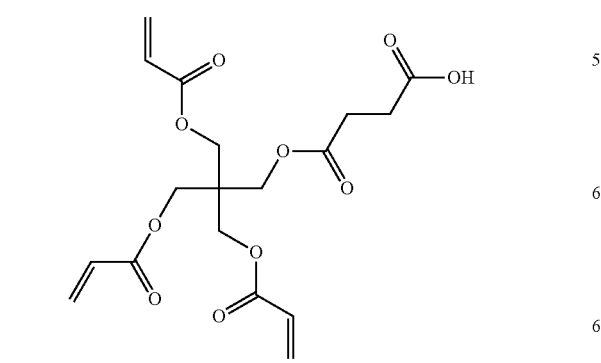

(a-2)

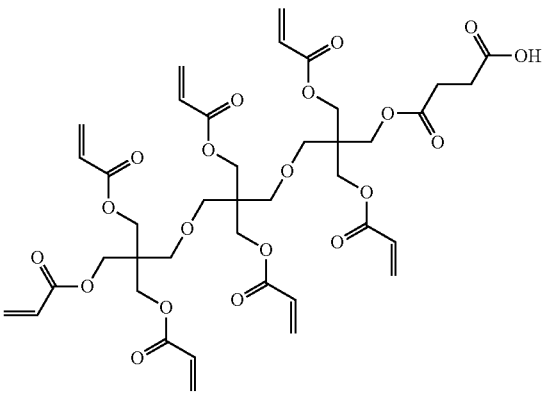

(a-3)

(Component B)
b-1: Dipentaerythritol hexaacrylate (DPHA, manufactured by Nippon Kayaku Co., Ltd.), 6-functional b-2: Pentaerythritol tetraacrylate (A-TMMT, manufactured by SHIN-NAKAMURA CHEMICAL CO. LTD.), 4-functional b-3: Trimethylolpropane triacrylate (M309, manufactured by Toagosei Co., Ltd.), 3-functional b-4: NK OLIGO U-15HA (manufactured by SHIN-NAKAMURA CHEMICAL CO. LTD.), 15-functional b-5: UA-306H (manufactured by Kyoeisha Chemical Co., Ltd.), 6-functional b'-1: 1,9-nonanediol diacrylate (A-NOD-N, manufactured by SHIN-NAKAMURA CHEMICAL CO. LTD.), 2-functional (Component C)
C-1: Compound 1 (synthesized product, see below), oxime ester compound C-2: IRGACURE OXE-01 (manufactured by BASF GmbH.), oxime ester compound, having the following structure C-3: IRGACURE OXE-02 (manufactured by BASF GmbH.), oxime ester compound, having the following structure

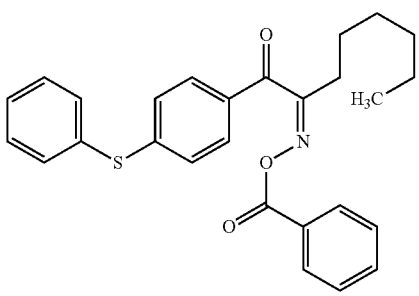

IRGACURE OXE01

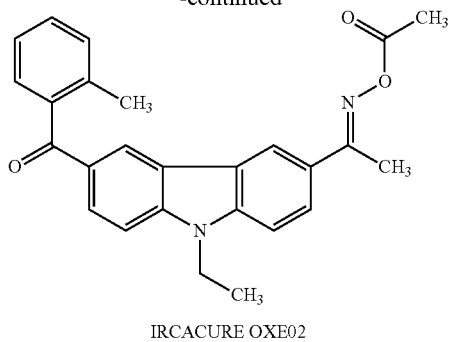

IRCACURE OXE02

(Component K)

K-1: Phenothiazine (manufactured by Tokyo Chemical Industry Co., Ltd.)

K-2: Phenoxazine (manufactured by Tokyo Chemical Industry Co., Ltd.) (Component E)

E-1: PMA-ST (manufactured by Nissan Chemical Industries, Limited), silica particles, having an average particle diameter of 10 to 15 nm E-2: MIBK-ST-L (manufactured by Nissan Chemical Industries, Limited), silica particles, having an average particle diameter of 40 to 50 nm (Component N)

N-1: TAKENATE B870N (manufactured by Mitsui Chemicals Co., Ltd.) (base isocyanate: isophorone diisocyanate, blocking agent: MEK oxime)

N-2: DESMODUR BL3575/1 MPA/SN (manufactured by Sumitomo Bayer urethane Co., Ltd.) (base isocyanate: hexamethylene diisocyanate, blocking agent: methyl ethyl ketone oxime)

N-3: DESMODUR BL4265SN (manufactured by Sumitomo Bayer urethane Co., Ltd.) (base isocyanate: isophorone diisocyanate, blocking agent: methyl ethyl ketone oxime)

N-4: DURANATE SBN-70D (manufactured by Mitsui Chemicals Co., Ltd.) (base isocyanate: 1,6-hexamethylene diisocyanate, blocking agent: pyrazole derivative)

(Component S)

SC-1: KBM-403 (3-glycidoxypropyltrimethoxysilane, manufactured by Shin-Etsu Chemical Co., Ltd.)

SC-2: KBM-5103 (3-acryloxypropyltrimethoxysilane, manufactured by Shin-Etsu Chemical Co., Ltd.)

(Component D)

D-1: Propylene glycol monomethylether acetate (manufactured by Daicel Corporation)

D-2: Methylethyl diglycol (manufactured by Daicel Corporation)

D-3: 1,3-butylene glycol diacetate

D-4: Tetrahydrofurfuryl alcohol (Surfactant)

W-1: MEGAFAC F554 (manufactured by DIC Corporation), fluorine-based surfactant (Sensitizer)

I-1: DBA (dibutoxyanthracene having the following structure) (manufactured by KAWASAKI KASEI CHEMICALS LTD.)

(Antioxidant)

J-1: ADK STAB AO-60 (hindered phenolic antioxidant, (manufactured by ADEKA CORPORATION))

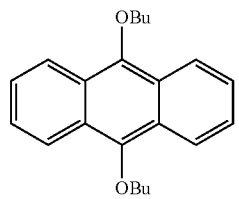

I-1

(In the formula, Bu represents a butyl group.)

<Synthesis of Compound 1 (C-1)>

[Synthesis of Compound A]

Ethylcarbazole (100.0 g, 0.512 mol) was dissolved in 260 ml of chlorobenzene and cooled at 0° C., and then aluminum chloride (70.3 g, 0.527 mol) was added thereto. Subsequently, o-toluoyl chloride (81.5 g, 0.527 mol) was added dropwise for 40 minutes, the temperature was raised to room temperature (25° C., the same will be applied below), and the materials were stirred for 3 hours. Next, the resultant was cooled at 0° C. and then aluminum chloride (75.1 g, 0.563 mol) was added thereto. 4-chlorobutyryl chloride (79.4 g, 0.563 mol) was added dropwise for 40 minutes, the temperature was raised to room temperature, and the materials were stirred for 3 hours. A mixed solution of 156 ml of a 35% by mass aqueous hydrochloric acid solution and 392 ml of distilled water was cooled to 0° C. and the reaction solution was added dropwise. The precipitated solid was filtered by suction and then washed with distilled water and methanol. Recrystallization was conducted using acetonitrile and then Compound A having the following structure (yield: 164.4 g, yield ratio: 77%) was obtained.

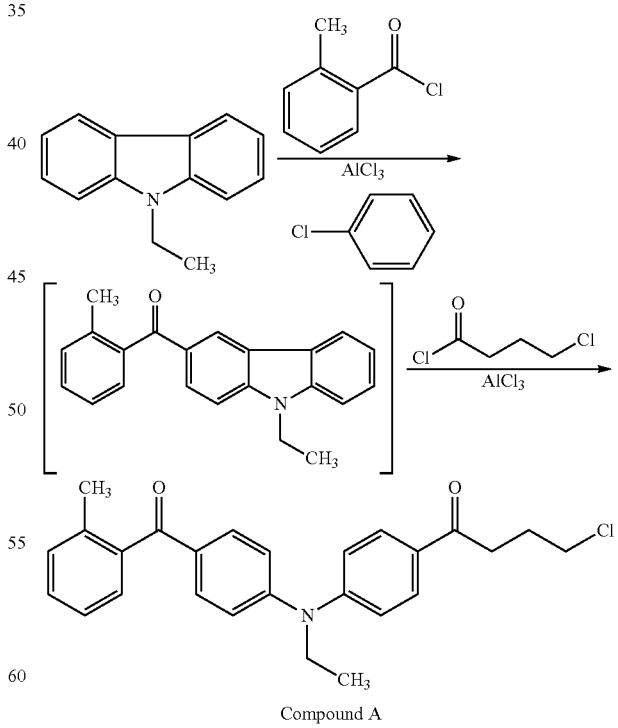

Compound A

[Synthesis of Compound B]

Compound A obtained above (20.0 g, 47.9 mmol) was dissolved in 64 ml of tetrahydrofuran (THF), 4-chlorobenzenethiol (7.27 g, 50.2 mmol) and sodium iodide (0.7 g, 4.79 mmol) were added thereto. Subsequently, sodium hydroxide (2.0 g, 50.2 mmol) was added to the reaction solution and reflux was carried out for 2 hours. Next, the resultant was cooled to 0° C. and then SM-28 (11.1 g, 57.4 mmol, sodium methoxide 28% methanol solution, manufactured by Wako Pure Chemical Industries, Ltd.) was added dropwise for 20 minutes. The temperature was raised to room temperature and the materials were stirred for 2 hours. Next, the resultant was cooled to 0° C. and then isopentyl nitrite (6.73 g, 57.4 mmol) was added dropwise for 20 minutes. The temperature was raised to room temperature and the materials were stirred for 3 hours. The reaction solution was diluted with 120 ml of acetone and added dropwise to a 0.1 N aqueous hydrochloric acid solution cooled to 0° C. The precipitated solid was filtered by suction and then washed with distilled water. Subsequently, recrystallization was conducted using acetonitrile and then Compound B having the following structure (yield: 17.0 g, yield ratio: 64%) was obtained.

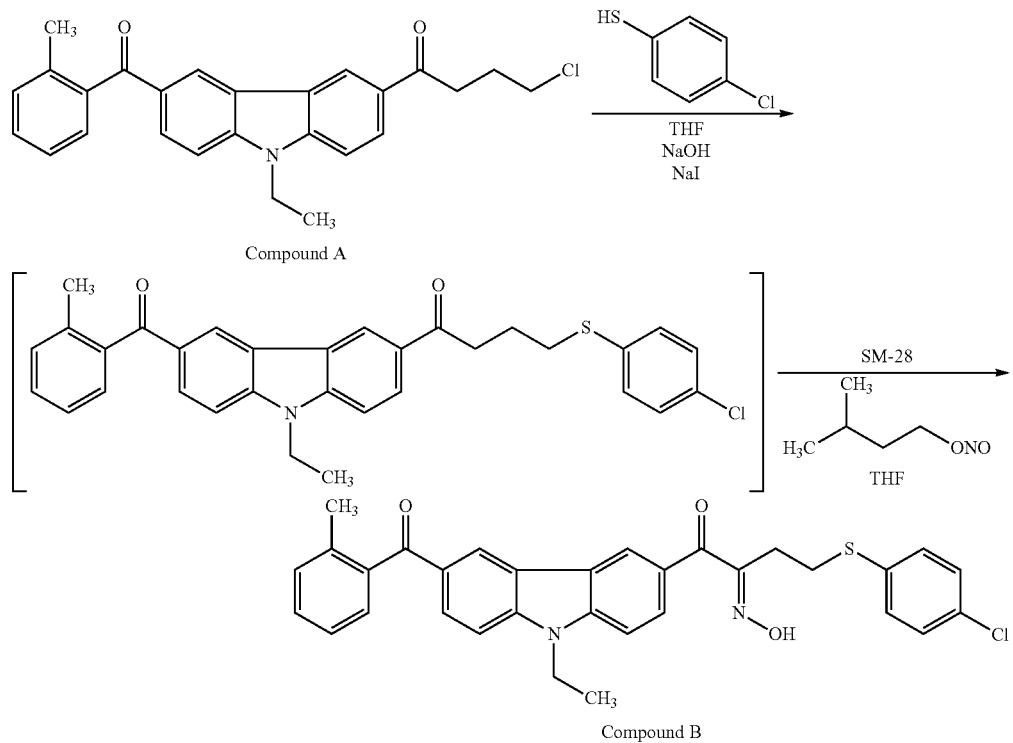

[Synthesis of Compound 1]

Compound B (18.0 g, 32.4 mmol) was dissolved in 90 ml of N-methyl pyrrolidone (NMP) and triethylamine (Et$_3$N, 3.94 g, 38.9 mmol) was added thereto. Next, the resultant was cooled to 0° C. and then acetyl chloride (AcCl, 3.05 g, 38.9 mmol) was added dropwise for 20 minutes. Then, the temperature was raised to room temperature and the materials were stirred for 2 hours. The reaction solution was added dropwise to 150 ml of distilled water cooled to 0° C. The precipitated solid was filtered by suction, then washed with 200 ml of isopropyl alcohol cooled to 0° C., and dried. Then, Compound 1 (yield: 19.5 g, yield ratio: 99%) was obtained.

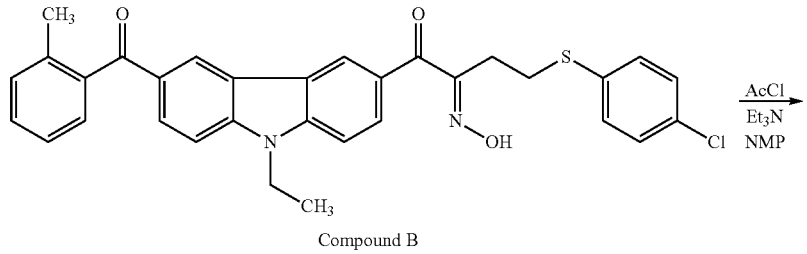

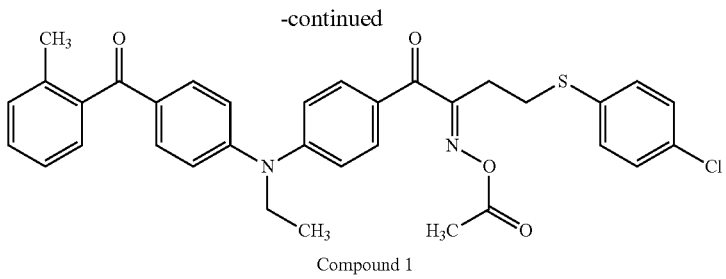

Compound 1

Further, the structure of Compound 1 obtained was determined by NMR.

$^1$H-NMR (400 MHz, CDCl$_3$): δ=8.86 (s, 1H), 8.60 (s, 1H), 8.31 (d, 1H, J=8.0 Hz), 8.81 (d, 1H, J=8.0 Hz), 7.51-7.24 (m, 10H), 7.36 (q, 2H, 7.4 Hz), 3.24-3.13 (m, 4H), 2.36 (s, 3H), 2.21 (s, 3H), 1.50 (t, 3H, 7.4 Hz).

Examples 1 to 100 and Comparative Examples 1 to 10

Preparation of Photosensitive Composition

Each component was formulated and stirred as shown in Tables 1 to 3 below to form an organic solvent solutions and/or dispersion. The solution and/or dispersion was filtered using a filter made of polytetrafluoroethylene and having a pore diameter of 0.3 µm and thus the photosensitive composition of the present invention was obtained. The unit of each component shown in Tables is parts by mass excluding the solid content concentration. In addition, the unit of components other than an organic solvent is parts by mass in terms of solid content.

Composition A used in Comparative Example 9 has the following composition described in Example 1 of JP05201066B. In addition, in Comparative Example 10, phenothiazine was added in an amount corresponding to 0.2% by mass of the total solid content of Composition A above.

[Composition A]

A solution including Copolymer (A-1) below (in an amount corresponding to 100 parts by mass (solid content) of Copolymer (A-1)), 200 parts by mass of mono-[3-(3-acryloiloxy-2,2-bis-acryloyloxymethyl-propoxy)-2,2-bis-acryloyloxymethyl-propyl]succinate, 10 parts by mass of 2-methyl-1-(4-methylthiophenyl)-2-morpholino propan-1-one (product name: IRGACURE 907, manufactured by Ciba Specialty Chemicals), 30 parts by mass of novolac type epoxy resin (product name: EPICOAT 152, manufactured by Japan Epoxy Resin Co. Ltd.), 30 parts by mass of γ-glycidoxypropyltrimethoxysilane, and 0.2 parts by mass of FTX-218 as a surfactant (manufactured by Neos Corporation) were added and a solvent of diethylene glycol methylethylether was further added such that the solid content concentration became 22% by weight. Then, the resultant was filtered using a miliporefilter having a pore diameter of 0.5 µm to prepare a composition.

Copolymer (A-1) above was obtained in the following manner.

5 parts by mass of 2,2'-azobis(2,4-dimethylvaleronitrile) and 200 parts by mass of diethylene glycol methylethylether were put into a flask provided with a cooling tube and a stirrer. Subsequently, 40 parts by mass of glycidyl methacrylate, 18 parts by mass of styrene, 20 parts by mass of methacrylic acid, and 22 parts by mass of N-cyclohexylmaleimide were put in the flask and the materials were gently stirred after nitrogen purging. The temperature of the solution was raised to 70° C. and the temperature was maintained for 5 hours to obtain a polymer solution including Copolymer (A-1). The solid content concentration of the obtained polymer solution was 33.1% by mass. The number average molecular weight of the obtained polymer was 7,000 (the number average molecular weight is a molecular weight in terms of polystyrene measured using gel permeation chromatography (GPC) HLC-8020 (manufactured by TOSOH CORPORATION)). In addition, the molecular weight distribution (Mw/Mn) was 2.

<Evaluation of Patternability>

A glass substrate (EAGLE XG, thickness: 0.7 mm (manufactured by Corning Incorporated)) was exposed to hexamethyldisilazane (HMDS) steam for 30 seconds, and each photosensitive composition was applied by spin coating. Then, the substrate was pre-baked on a hotplate at 90° C. for 120 seconds to volatilize the solvent and thus a photosensitive composition layer having a film thickness of 3.0 µm was formed.

Next, the obtained photosensitive composition layer was exposed using MPA 5500CF (high pressure mercury lamp) manufactured by Canon Inc. via a predetermined mask. The exposure amount was set to an exposure amount enough to not dissolve the exposed portion during development. The photosensitive composition layer after exposure was developed with an alkali developer (2.38% aqueous tetramethyl ammonium hydroxide solution) at 23° C. for 60 seconds and then rinsed with ultrapure water for 20 seconds. When holes having a diameter of 1 mm were resolved through these operations, the optimum i-ray exposure amount (Eopt) was set to sensitivity.

The hole diameter when a permanent film having a hole pattern was prepared in an exposure amount most suitably for resolving each mask diameter was evaluated. In the following evaluation, the actual hole pattern diameter was defined as the size of the bottom (bottom surface) of the resist. As a difference between the hole diameter and the mask diameter decreases (that is, as mask linearity increases), the panel is more easily designed, which is more preferable.

The evaluation criteria are as follows.

5: A ratio between the mask diameter and the actual hole pattern diameter is ±10% or less.

4: A ratio between the mask diameter and the actual hole pattern diameter is more than ±10% and ±20% or less.

3: A ratio between the mask diameter and the actual hole pattern diameter is more than ±20% and ±30% or less.

2: A ratio between the mask diameter and the actual hole pattern diameter is more than ±30% and ±40% or less.

1: A ratio between the mask diameter and the actual hole pattern diameter is more than ±40%.

<Salt Water Spray Test for Cured Film (Artificial Sweat Resistance (Sweat Resistance) Evaluation Test)>

Each photosensitive composition prepared above was applied to a glass substrate by spin coating and pre-baked at 90° C. for 120 seconds to obtain a coating film having a film thickness of 2.0 μm. Next, the coating film was irradiated with light using a high pressure mercury lamp at an intensity of 500 mJ/cm² (in terms of i-ray) and further baked in an oven at 120° C. for 60 minutes to prepare a cured film. Thus, a sample for artificial sweat resistance evaluation test was obtained.

Next, referring to JIS standards (Z 2371), the sample was placed in the test tank and salt water (pH=6.7) having an concentration of 50 g/L was sprayed thereon at temperature of the test tank of 35° C. in a spraying amount of 1.5 mL/h for 48 hours using a salt water spray test machine (STP-90V2, manufactured by Suga Test Instruments Co., Ltd.). After the spraying was completed, the salt water was wiped and the surface state of the sample for evaluation was observed. Evaluation was carried out based on the following grade.

5: There is no change on the surface of the protective film.
4: Very minor traces are observed on the surface of the protective film but there is no change in copper.
3: Traces are observed on the surface of the protective film but there is no change in copper.
2: Traces are observed on the surface of the protective film and copper is discolored.
1: Traces are observed on the surface of the protective film and copper is noticeably discolored.

TABLE 1

|  | Component A | | Component B | | (A + B)/ total organic solid content | (A)/ (A) + (B) | Component C | | Component K | | Component E | | Component N | |
| --- | --- | --- | --- | --- | --- | --- | --- | --- | --- | --- | --- | --- | --- | --- |
|  | Type | Amount | Type | Amount | | | Type | Amount | Type | Amount | Type | Amount | Type | Amount |
| Example 1 | A-1 | 35 | B-1 | 58 | 92.7% | 37.6% | C-1 | 2 | K-1 | 0.2 | — | — | N-2 | 5 |
| Example 2 | A-1 | 22 | B-1 | 71 | 92.7% | 23.7% | C-1 | 2 | K-1 | 0.2 | — | — | N-2 | 5 |
| Example 3 | A-1 | 10 | B-1 | 83 | 92.7% | 10.8% | C-1 | 2 | K-1 | 0.2 | — | — | N-2 | 5 |
| Example 4 | A-1 | 22 | B-1 | 76 | 97.6% | 22.4% | C-1 | 2 | K-1 | 0.2 | — | — | N-2 | 0.08 |
| Example 5 | A-1 | 22 | B-1 | 76 | 97.6% | 22.4% | C-1 | 2 | K-1 | 0.2 | — | — | N-2 | 0.15 |
| Example 6 | A-1 | 22 | B-1 | 75 | 97.2% | 22.7% | C-1 | 2 | K-1 | 0.2 | — | — | N-2 | 0.5 |
| Example 7 | A-1 | 22 | B-1 | 66 | 87.7% | 25.0% | C-1 | 2 | K-1 | 0.2 | — | — | N-2 | 10 |
| Example 8 | A-1 | 22 | B-1 | 58 | 79.8% | 27.5% | C-1 | 2 | K-1 | 0.2 | — | — | N-2 | 18 |
| Example 9 | A-1 | 22 | B-1 | 51 | 72.8% | 30.1% | C-1 | 2 | K-1 | 0.2 | — | — | N-2 | 25 |
| Example 10 | A-1 | 22 | B-1 | 71 | 92.9% | 23.7% | C-1 | 2 | K-1 | 0.05 | — | — | N-2 | 5 |
| Example 11 | A-1 | 22 | B-1 | 71 | 92.8% | 23.7% | C-1 | 2 | K-1 | 0.1 | — | — | N-2 | 5 |
| Example 12 | A-1 | 22 | B-1 | 71 | 92.6% | 23.7% | C-1 | 2 | K-1 | 0.3 | — | — | N-2 | 5 |
| Example 13 | A-1 | 22 | B-1 | 70 | 92.4% | 23.9% | C-1 | 2 | K-1 | 0.5 | — | — | N-2 | 5 |
| Example 14 | A-1 | 22 | B-1 | 70 | 92.2% | 23.9% | C-1 | 2 | K-1 | 0.7 | — | — | N-2 | 5 |
| Example 15 | A-1/ A-3 | 12/ 10 | B-1/ B-2 | 40/31 | 92.7% | 23.7% | C-1 | 2 | K-1 | 0.2 | — | — | N-2 | 5 |
| Example 16 | A-1 | 30 | B-1 | 48 | 77.8% | 38.5% | C-1 | 2 | K-1 | 0.2 | — | — | N-2 | 5 |
| Example 17 | A-1 | 20 | B-1 | 58 | 77.8% | 25.6% | C-1 | 2 | K-1 | 0.2 | — | — | N-2 | 5 |
| Example 18 | A-1 | 10 | B-1 | 68 | 77.8% | 12.8% | C-1 | 2 | K-1 | 0.2 | — | — | N-2 | 5 |
| Example 19 | A-1 | 30 | B-1 | 48 | 77.8% | 38.5% | C-1 | 2 | K-1 | 0.2 | — | — | N-2 | 5 |
| Example 20 | A-1 | 20 | B-1 | 58 | 77.8% | 25.6% | C-1 | 2 | K-1 | 0.2 | — | — | N-2 | 5 |
| Example 21 | A-1 | 10 | B-1 | 68 | 77.8% | 12.8% | C-1 | 2 | K-1 | 0.2 | — | — | N-2 | 5 |
| Example 22 | A-1 | 10 | B-1 | 78 | 87.7% | 11.4% | C-1 | 2 | K-1 | 0.2 | — | — | N-2 | 5 |
| Example 23 | A-1 | 10 | B-1 | 53 | 62.8% | 15.9% | C-1 | 2 | K-1 | 0.2 | — | — | N-2 | 5 |
| Example 24 | A-1 | 10 | B-1 | 43 | 52.8% | 18.9% | C-1 | 2 | K-1 | 0.2 | — | — | N-2 | 5 |
| Example 25 | A-1 | 10 | B-1 | 33 | 42.9% | 23.3% | C-1 | 2 | K-1 | 0.2 | — | — | N-2 | 5 |
| Example 26 | A-1 | 10 | B-1 | 23 | 32.9% | 30.3% | C-1 | 2 | K-1 | 0.2 | — | — | N-2 | 5 |

TABLE 1-continued

| | | | | | | | | | | | | | | | |
|---|---|---|---|---|---|---|---|---|---|---|---|---|---|---|---|
| Example 27 | A-1 | 22 | B-1 | 71 | 92.7% | 23.7% | C-2 | 2 | K-1 | 0.2 | — | — | N-2 | 5 |
| Example 28 | A-1 | 22 | B-1 | 71 | 92.7% | 23.7% | C-3 | 2 | K-1 | 0.2 | — | — | N-2 | 5 |
| Example 29 | A-1 | 22 | B-1 | 71 | 92.7% | 23.7% | C-1 | 2 | K-2 | 0.2 | — | — | N-2 | 5 |
| Example 30 | A-1 | 22 | B-1 | 71 | 92.7% | 23.7% | C-1 | 2 | K-1 | 0.2 | — | — | N-2 | 5 |
| Example 31 | A-1 | 22 | B-1 | 71 | 92.7% | 23.7% | C-1 | 2 | K-1 | 0.2 | — | — | N-1 | 5 |
| Example 32 | A-1 | 20 | B-1 | 73 | 92.7% | 21.5% | C-1 | 2 | K-1 | 0.2 | — | — | N-3 | 5 |
| Example 33 | A-1 | 20 | B-1 | 73 | 92.7% | 21.5% | C-1 | 2 | K-1 | 0.2 | — | — | N-4 | 5 |
| Example 34 | A-1 | 20 | B-1 | 70 | 89.7% | 22.2% | C-1 | 2 | K-1 | 0.2 | — | — | N-2 | 5 |
| Example 35 | A-2 | 20 | B-1 | 73 | 92.7% | 21.5% | C-1 | 2 | K-1 | 0.2 | — | — | N-2 | 5 |
| Example 36 | A-3 | 20 | B-1 | 73 | 92.7% | 21.5% | C-1 | 2 | K-1 | 0.2 | — | — | N-2 | 5 |
| Example 37 | A-1 | 20 | B-2 | 73 | 92.7% | 21.5% | C-1 | 2 | K-1 | 0.2 | — | — | N-2 | 5 |

| | Component S | | Others | | Surfactant | | Component D | | Performance evaluation result | |
|---|---|---|---|---|---|---|---|---|---|---|
| | Type | Amount | Type | Amount | Type | Amount | Type | Amount | Pattern-ability | Sweat resistance |
| Example 1 | — | — | — | — | W-1 | 0.1 | D-1 | 300 | 5 | 3 |
| Example 2 | — | — | — | — | W-1 | 0.1 | D-1 | 300 | 5 | 4 |
| Example 3 | — | — | — | — | W-1 | 0.1 | D-1 | 300 | 4 | 5 |
| Example 4 | — | — | — | — | W-1 | 0.1 | D-1 | 300 | 5 | 3 |
| Example 5 | — | — | — | — | W-1 | 0.1 | D-1 | 300 | 5 | 4 |
| Example 6 | — | — | — | — | W-1 | 0.1 | D-1 | 300 | 5 | 5 |
| Example 7 | — | — | — | — | W-1 | 0.1 | D-1 | 300 | 5 | 5 |
| Example 8 | — | — | — | — | W-1 | 0.1 | D-1 | 300 | 4 | 5 |
| Example 9 | — | — | — | — | W-1 | 0.1 | D-1 | 300 | 3 | 5 |
| Example 10 | — | — | — | — | W-1 | 0.1 | D-1 | 300 | 4 | 4 |
| Example 11 | — | — | — | — | W-1 | 0.1 | D-1 | 300 | 5 | 4 |
| Example 12 | — | — | — | — | W-1 | 0.1 | D-1 | 300 | 5 | 4 |
| Example 13 | — | — | — | — | W-1 | 0.1 | D-1 | 300 | 5 | 4 |
| Example 14 | — | — | — | — | W-1 | 0.1 | D-1 | 300 | 5 | 4 |
| Example 15 | — | — | — | — | W-1 | 0.1 | D-1 | 300 | 5 | 4 |
| Example 16 | — | — | P-1 | 15 | W-1 | 0.1 | D-1 | 300 | 5 | 3 |
| Example 17 | — | — | P-1 | 15 | W-1 | 0.1 | D-1 | 300 | 4 | 4 |
| Example 18 | — | — | P-1 | 15 | W-1 | 0.1 | D-1 | 300 | 3 | 5 |
| Example 19 | — | — | P-2 | 15 | W-1 | 0.1 | D-1 | 300 | 5 | 3 |
| Example 20 | — | — | P-2 | 15 | W-1 | 0.1 | D-1 | 300 | 4 | 4 |
| Example 21 | — | — | P-2 | 15 | W-1 | 0.1 | D-1 | 300 | 3 | 5 |
| Example 22 | — | — | P-2 | 5 | W-1 | 0.1 | D-1 | 300 | 4 | 5 |
| Example 23 | — | — | P-2 | 30 | W-1 | 0.1 | D-1 | 300 | 5 | 4 |

TABLE 1-continued

|  |  |  |  |  |  |  |  |  |  |  |
|---|---|---|---|---|---|---|---|---|---|---|
| Example 24 | — | — | P-2 | 40 | W-1 | 0.1 | D-1 | 300 | 5 | 4 |
| Example 25 | — | — | P-2 | 50 | W-1 | 0.1 | D-1 | 300 | 5 | 3 |
| Example 26 | — | — | P-2 | 60 | W-1 | 0.1 | D-1 | 300 | 5 | 3 |
| Example 27 | — | — | — | — | W-1 | 0.1 | D-1 | 300 | 5 | 4 |
| Example 28 | — | — | — | — | W-1 | 0.1 | D-1 | 300 | 5 | 4 |
| Example 29 | — | — | — | — | W-1 | 0.1 | D-1 | 300 | 5 | 4 |
| Example 30 | — | — | — | — | W-1 | 0.1 | D-1 | 300 | 5 | 4 |
| Example 31 | — | — | — | — | W-1 | 0.1 | D-1 | 300 | 5 | 4 |
| Example 32 | — | — | — | — | W-1 | 0.1 | D-1 | 300 | 5 | 4 |
| Example 33 | — | — | — | — | W-1 | 0.1 | D-1 | 300 | 5 | 4 |
| Example 34 | — | — | I-1 | 3 | W-1 | 0.1 | D-1 | 300 | 5 | 4 |
| Example 35 | — | — | — | — | W-1 | 0.1 | D-1 | 300 | 5 | 4 |
| Example 36 | — | — | — | — | W-1 | 0.1 | D-1 | 300 | 5 | 4 |
| Example 37 | — | — | — | — | W-1 | 0.1 | D-1 | 300 | 5 | 4 |

TABLE 2

| | Component A | | Component B | | (A + B)/ total organic solid content | (A)/ (A) + (B) | Component C | | Component K | | Component E | | Component N | |
|---|---|---|---|---|---|---|---|---|---|---|---|---|---|---|
| | Type | Amount | Type | Amount | | | Type | Amount | Type | Amount | Type | Amount | Type | Amount |
| Example 38 | A-1 | 20 | B-3 | 73 | 92.7% | 21.5% | C-1 | 2 | K-1 | 0.2 | — | — | N-2 | 5 |
| Example 39 | A-1 | 20 | B-4 | 73 | 92.7% | 21.5% | C-1 | 2 | K-1 | 0.2 | — | — | N-2 | 5 |
| Example 40 | A-1 | 20 | B-5 | 73 | 92.7% | 21.5% | C-1 | 2 | K-1 | 0.2 | — | — | N-2 | 5 |
| Example 41 | A-1 | 33 | B-1 | 51 | 83.7% | 39.3% | C-1 | 2 | K-1 | 0.2 | — | — | N-2 | 5 |
| Example 42 | A-1 | 22 | B-1 | 62 | 83.7% | 26.2% | C-1 | 2 | K-1 | 0.2 | — | — | N-2 | 5 |
| Example 43 | A-1 | 10 | B-1 | 74 | 83.7% | 11.9% | C-1 | 2 | K-1 | 0.2 | — | — | N-2 | 5 |
| Example 44 | A-1 | 22 | B-1 | 67 | 88.7% | 24.7% | C-1 | 2 | K-1 | 0.2 | — | — | N-2 | 0.08 |
| Example 45 | A-1 | 22 | B-1 | 67 | 88.6% | 24.7% | C-1 | 2 | K-1 | 0.2 | — | — | N-2 | 0.15 |
| Example 46 | A-1 | 22 | B-1 | 66 | 88.2% | 25.0% | C-1 | 2 | K-1 | 0.2 | — | — | N-2 | 0.5 |
| Example 47 | A-1 | 22 | B-1 | 57 | 78.8% | 27.8% | C-1 | 2 | K-1 | 0.2 | — | — | N-2 | 10 |
| Example 48 | A-1 | 22 | B-1 | 49 | 70.8% | 31.0% | C-1 | 2 | K-1 | 0.2 | — | — | N-2 | 18 |
| Example 49 | A-1 | 22 | B-1 | 42 | 63.8% | 34.4% | C-1 | 2 | K-1 | 0.2 | — | — | N-2 | 25 |
| Example 50 | A-1 | 22 | B-1 | 68 | 89.7% | 24.4% | C-1 | 2 | K-1 | 0.2 | — | — | N-2 | 5 |
| Example 51 | A-1 | 22 | B-1 | 65 | 86.7% | 25.3% | C-1 | 2 | K-1 | 0.2 | — | — | N-2 | 5 |
| Example 52 | A-1 | 22 | B-1 | 59 | 80.8% | 27.2% | C-1 | 2 | K-1 | 0.2 | — | — | N-2 | 5 |
| Example 53 | A-1 | 22 | B-1 | 56 | 77.8% | 28.2% | C-1 | 2 | K-1 | 0.2 | — | — | N-2 | 5 |
| Example 54 | A-1 | 22 | B-1 | 53 | 74.8% | 29.3% | C-1 | 2 | K-1 | 0.2 | — | — | N-2 | 5 |
| Example 55 | A-1 | 22 | B-1 | 50 | 71.8% | 30.6% | C-1 | 2 | K-1 | 0.2 | — | — | N-2 | 5 |

TABLE 2-continued

| | | | | | | | | | | | | | | | |
|---|---|---|---|---|---|---|---|---|---|---|---|---|---|---|---|
| Example 56 | A-1 | 20 | B-1 | 49 | 68.8% | 29.0% | C-1 | 2 | K-1 | 0.2 | — | — | N-2 | 5 |
| Example 57 | A-1 | 10 | B-1 | 59 | 68.8% | 14.5% | C-1 | 2 | K-1 | 0.2 | — | — | N-2 | 5 |
| Example 58 | A-1 | 8 | B-1 | 61 | 68.8% | 11.6% | C-1 | 2 | K-1 | 0.2 | — | — | N-2 | 5 |
| Example 59 | A-1 | 20 | B-1 | 64 | 83.7% | 23.8% | C-1 | 2 | K-2 | 0.2 | — | — | N-2 | 5 |
| Example 60 | A-1 | 20 | B-1 | 64 | 83.7% | 23.8% | C-1 | 2 | K-1 | 0.2 | — | — | N-1 | 5 |
| Example 61 | A-1 | 20 | B-1 | 64 | 83.7% | 23.8% | C-1 | 2 | K-1 | 0.2 | — | — | N-3 | 5 |
| Example 62 | A-1 | 20 | B-1 | 64 | 83.7% | 23.8% | C-1 | 2 | K-1 | 0.2 | — | — | N-4 | 5 |
| Example 63 | A-2 | 20 | B-1 | 64 | 83.7% | 23.8% | C-1 | 2 | K-1 | 0.2 | — | — | N-2 | 5 |
| Example 64 | A-3 | 20 | B-1 | 64 | 83.7% | 23.8% | C-1 | 2 | K-1 | 0.2 | — | — | N-2 | 5 |
| Example 65 | A-1 | 20 | B-2 | 64 | 83.7% | 23.8% | C-1 | 2 | K-1 | 0.2 | — | — | N-2 | 5 |
| Example 66 | A-1 | 20 | B-3 | 64 | 83.7% | 23.8% | C-1 | 2 | K-1 | 0.2 | — | — | N-2 | 5 |
| Example 67 | A-1 | 20 | B-4 | 64 | 83.7% | 23.8% | C-1 | 2 | K-1 | 0.2 | — | — | N-2 | 5 |
| Example 68 | A-1 | 20 | B-5 | 64 | 83.7% | 23.8% | C-1 | 2 | K-1 | 0.2 | — | — | N-2 | 5 |
| Example 69 | A-1 | 20 | B-1 | 34 | 76.8% | 37.0% | C-1 | 2 | K-1 | 0.2 | E-1 | 30 | N-2 | 5 |
| Example 70 | A-1 | 15 | B-1 | 28 | 61.2% | 34.9% | C-1 | 2 | K-1 | 0.2 | E-1 | 30 | N-2 | 10 |
| Example 71 | A-1 | 15 | B-1 | 23 | 54.1% | 39.5% | C-1 | 2 | K-1 | 0.2 | E-1 | 30 | N-2 | 15 |
| Example 72 | A-1 | 15 | B-1 | 23 | 54.1% | 39.5% | C-1 | 2 | K-1 | 0.2 | E-1 | 30 | N-2 | 10 |

| | Component S | | Others | | Surfactant | | Component D | | Performance evaluation result | |
|---|---|---|---|---|---|---|---|---|---|---|
| | Type | Amount | Type | Amount | Type | Amount | Type | Amount | Patternability | Sweat resistance |
| Example 38 | — | — | — | — | W-1 | 0.1 | D-1 | 300 | 5 | 4 |
| Example 39 | — | — | — | — | W-1 | 0.1 | D-1 | 300 | 3 | 4 |
| Example 40 | — | — | — | — | W-1 | 0.1 | D-1 | 300 | 4 | 4 |
| Example 41 | Sc-2 | 9 | — | — | W-1 | 0.1 | D-1 | 300 | 5 | 4 |
| Example 42 | Sc-2 | 9 | — | — | W-1 | 0.1 | D-1 | 300 | 5 | 5 |
| Example 43 | Sc-2 | 9 | — | — | W-1 | 0.1 | D-1 | 300 | 4 | 5 |
| Example 44 | Sc-2 | 9 | — | — | W-1 | 0.1 | D-1 | 300 | 5 | 4 |
| Example 45 | Sc-2 | 9 | — | — | W-1 | 0.1 | D-1 | 300 | 5 | 5 |
| Example 46 | Sc-2 | 9 | — | — | W-1 | 0.1 | D-1 | 300 | 5 | 5 |
| Example 47 | Sc-2 | 9 | — | — | W-1 | 0.1 | D-1 | 300 | 5 | 5 |
| Example 48 | Sc-2 | 9 | — | — | W-1 | 0.1 | D-1 | 300 | 4 | 5 |
| Example 49 | Sc-2 | 9 | — | — | W-1 | 0.1 | D-1 | 300 | 3 | 5 |
| Example 50 | Sc-2 | 3 | — | — | W-1 | 0.1 | D-1 | 300 | 5 | 4 |
| Example 51 | Sc-2 | 6 | — | — | W-1 | 0.1 | D-1 | 300 | 5 | 5 |
| Example 52 | Sc-2 | 12 | — | — | W-1 | 0.1 | D-1 | 300 | 5 | 5 |
| Example 53 | Sc-2 | 15 | — | — | W-1 | 0.1 | D-1 | 300 | 5 | 5 |
| Example 54 | Sc-2 | 18 | — | — | W-1 | 0.1 | D-1 | 300 | 5 | 5 |
| Example 55 | Sc-2 | 21 | — | — | W-1 | 0.1 | D-1 | 300 | 5 | 5 |
| Example 56 | Sc-2 | 9 | P-1 | 15 | W-1 | 0.1 | D-1 | 300 | 5 | 4 |

TABLE 2-continued

| | | | | | | | | | | | |
|---|---|---|---|---|---|---|---|---|---|---|---|
| Example 57 | Sc-2 | 9 | P-1 | 15 | W-1 | 0.1 | D-1 | 300 | 4 | 5 |
| Example 58 | Sc-2 | 9 | P-1 | 15 | W-1 | 0.1 | D-1 | 300 | 3 | 5 |
| Example 59 | Sc-2 | 9 | — | — | W-1 | 0.1 | D-1 | 300 | 5 | 5 |
| Example 60 | Sc-2 | 9 | — | — | W-1 | 0.1 | D-1 | 300 | 5 | 5 |
| Example 61 | Sc-2 | 9 | — | — | W-1 | 0.1 | D-1 | 300 | 5 | 5 |
| Example 62 | Sc-2 | 9 | — | — | W-1 | 0.1 | D-1 | 300 | 5 | 5 |
| Example 63 | Sc-2 | 9 | — | — | W-1 | 0.1 | D-1 | 300 | 5 | 5 |
| Example 64 | Sc-2 | 9 | — | — | W-1 | 0.1 | D-1 | 300 | 5 | 5 |
| Example 65 | Sc-2 | 9 | — | — | W-1 | 0.1 | D-1 | 300 | 5 | 5 |
| Example 66 | Sc-2 | 9 | — | — | W-1 | 0.1 | D-2 | 300 | 5 | 5 |
| Example 67 | Sc-2 | 9 | — | — | W-1 | 0.1 | D-1 | 300 | 3 | 5 |
| Example 68 | Sc-2 | 9 | — | — | W-1 | 0.1 | D-4 | 300 | 4 | 5 |
| Example 69 | Sc-2 | 9 | — | — | W-1 | 0.1 | D-1 | 300 | 5 | 5 |
| Example 70 | Sc-2 | 15 | — | — | W-1 | 0.1 | D-1 | 300 | 5 | 5 |
| Example 71 | Sc-2 | 15 | — | — | W-1 | 0.1 | D-1 | 300 | 5 | 5 |
| Example 72 | Sc-2 | 20 | — | — | W-1 | 0.1 | D-1 | 300 | 5 | 5 |

TABLE 3

| | Component A | | Component B | | (A + B) total organic solid content | (A)/ (A) + (B) | Component C | | Component K | | Component E | |
|---|---|---|---|---|---|---|---|---|---|---|---|---|
| | Type | Amount | Type | Amount | | | Type | Amount | Type | Amount | Type | Amount |
| Example 73 | A-1 | 10 | B-1 | 23 | 46.9% | 30.3% | C-1 | 2 | K-1 | 0.2 | E-1 | 30 |
| Example 74 | A-1 | 10 | B-1 | 44 | 76.8% | 18.5% | C-1 | 2 | K-1 | 0.2 | E-1 | 30 |
| Example 75 | A-1 | 6 | B-1 | 48 | 76.8% | 11.1% | C-1 | 2 | K-1 | 0.2 | E-1 | 30 |
| Example 76 | A-1 | 10 | B-1 | 49 | 83.8% | 16.9% | C-1 | 2 | K-1 | 0.2 | E-1 | 30 |
| Example 77 | A-1 | 10 | B-1 | 49 | 83.7% | 16.9% | C-1 | 2 | K-1 | 0.2 | E-1 | 30 |
| Example 78 | A-1 | 10 | B-1 | 48 | 83.1% | 17.2% | C-1 | 2 | K-1 | 0.2 | E-1 | 30 |
| Example 79 | A-1 | 10 | B-1 | 39 | 69.7% | 20.4% | C-1 | 2 | K-1 | 0.2 | E-1 | 30 |
| Example 80 | A-1 | 10 | B-1 | 31 | 58.3% | 24.4% | C-1 | 2 | K-1 | 0.2 | E-1 | 30 |
| Example 81 | A-1 | 10 | B-1 | 24 | 48.4% | 29.4% | C-1 | 2 | K-1 | 0.2 | E-1 | 30 |
| Example 82 | A-1 | 20 | B-1 | 34 | 63.3% | 37.0% | C-1 | 2 | K-1 | 0.2 | E-1 | 15 |
| Example 83 | A-1 | 10 | B-1 | 44 | 63.3% | 18.5% | C-1 | 2 | K-1 | 0.2 | E-1 | 15 |
| Example 84 | A-1 | 6 | B-1 | 48 | 63.3% | 11.1% | C-1 | 2 | K-1 | 0.2 | E-1 | 15 |
| Example 85 | A-1 | 10 | B-1 | 44 | 76.8% | 18.5% | C-1 | 2 | K-1 | 0.2 | E-1 | 50 |
| Example 86 | A-1 | 10 | B-1 | 44 | 76.8% | 18.5% | C-1 | 2 | K-2 | 0.2 | E-1 | 30 |
| Example 87 | A-1 | 10 | B-1 | 44 | 76.8% | 18.5% | C-1 | 2 | K-1 | 0.2 | E-2 | 30 |
| Example 88 | A-1 | 10 | B-1 | 44 | 76.8% | 18.5% | C-1 | 2 | K-1 | 0.2 | E-1 | 30 |
| Example 89 | A-1 | 10 | B-1 | 44 | 76.8% | 18.5% | C-1 | 2 | K-1 | 0.2 | E-1 | 30 |

TABLE 3-continued

| | | | | | | | | | | | | |
|---|---|---|---|---|---|---|---|---|---|---|---|---|
| Example 90 | A-1 | 10 | B-1 | 44 | 76.8% | 18.5% | C-1 | 2 | K-1 | 0.2 | E-1 | 30 |
| Example 91 | A-2 | 10 | B-1 | 44 | 76.8% | 18.5% | C-1 | 2 | K-1 | 0.2 | E-1 | 30 |
| Example 92 | A-3 | 10 | B-1 | 44 | 76.8% | 18.5% | C-1 | 2 | K-1 | 0.2 | E-1 | 30 |
| Example 93 | A-1 | 10 | B-2 | 44 | 76.8% | 18.5% | C-1 | 2 | K-1 | 0.2 | E-1 | 30 |
| Example 94 | A-1 | 10 | B-3 | 44 | 76.8% | 18.5% | C-1 | 2 | K-1 | 0.2 | E-1 | 30 |
| Example 95 | A-1 | 10 | B-4 | 44 | 76.8% | 18.5% | C-1 | 2 | K-1 | 0.2 | E-1 | 30 |
| Example 96 | A-1 | 10 | B-5 | 44 | 76.8% | 18.5% | C-1 | 2 | K-1 | 0.2 | E-1 | 30 |
| Example 97 | A-1 | 20 | B-1 | 43 | 89.6% | 31.7% | C-1 | 2 | K-1 | 0.2 | E-1 | 30 |
| Example 98 | A-1 | 15 | B-1 | 43 | 82.5% | 25.9% | C-1 | 2 | K-1 | 0.2 | E-1 | 30 |
| Example 99 | A-1 | 20 | B-1 | 43 | 73.9% | 31.7% | C-1 | 2 | K-1 | 0.2 | E-1 | 15 |
| Example 100 | A-1 | 10 | B-1 | 53 | 73.9% | 15.9% | C-1 | 2 | K-1 | 0.2 | E-1 | 15 |
| Comparative Example 1 | A-1 | 54 | — | — | 76.8% | 100.0% | C-1 | 2 | K-1 | 0.2 | E-1 | 30 |
| Comparative Example 2 | — | — | B-1 | 54 | 76.8% | 0.0% | C-1 | 2 | K-1 | 0.2 | E-1 | 30 |
| Comparative Example 3 | A-1 | 10 | B-1 | 44 | 77.0% | 18.5% | C-1 | 2 | — | — | E-1 | 30 |
| Comparative Example 4 | A-1 | 10 | B-1 | 49 | 83.9% | 16.9% | C-1 | 2 | K-1 | 0.2 | E-1 | 30 |
| Comparative Example 5 | A-1 | 59 | — | — | 83.9% | 100.0% | C-1 | 2 | K-1 | 0.2 | E-1 | 30 |
| Comparative Example 6 | — | — | B-1 | 59 | 83.9% | 0.0% | C-1 | 2 | K-1 | 0.2 | E-1 | 30 |
| Comparative Example 7 | A-1 | 10 | B-1 | 44 | 76.8% | 18.5% | C-1 | 2 | K-1 | 0.2 | E-1 | 30 |
| Comparative Example 8 | A-1 | 10 | B-1 | 44 | 76.8% | 18.5% | C-1 | 2 | K-1 | 0.2 | E-1 | 30 |
| Comparative Example 9 | Composition A | | | | | | | | | | | |
| Comparative Example 10 | Composition formed by adding 0.2% of phenothiazine to Composition A | | | | | | | | | | | |

| | Component N | | Component S | | Others | | Surfactant | | Component D | | Performance evaluation result | |
|---|---|---|---|---|---|---|---|---|---|---|---|---|
| | Type | Amount | Type | Amount | Type | Amount | Type | Amount | Type | Amount | Pattern-ability | Sweat resistance |
| Example 73 | N-2 | 15 | Sc-2 | 20 | — | — | W-1 | 0.1 | D-1 | 300 | 5 | 5 |
| Example 74 | N-2 | 5 | Sc-2 | 9 | — | — | W-1 | 0.1 | D-1 | 300 | 5 | 5 |
| Example 75 | N-2 | 5 | Sc-2 | 9 | — | — | W-1 | 0.1 | D-1 | 300 | 4 | 5 |
| Example 76 | N-2 | 0.08 | Sc-2 | 9 | — | — | W-1 | 0.1 | D-1 | 300 | 5 | 3 |

TABLE 3-continued

| | | | | | | | | | | | | |
|---|---|---|---|---|---|---|---|---|---|---|---|---|
| Example 77 | N-2 | 0.15 | Sc-2 | 9 | — | — | W-1 | 0.1 | D-1 | 300 | 5 | 4 |
| Example 78 | N-2 | 0.5 | Sc-2 | 9 | — | — | W-1 | 0.1 | D-1 | 300 | 5 | 5 |
| Example 79 | N-2 | 10 | Sc-2 | 9 | — | — | W-1 | 0.1 | D-1 | 300 | 5 | 5 |
| Example 80 | N-2 | 18 | Sc-2 | 9 | — | — | W-1 | 0.1 | D-1 | 300 | 4 | 5 |
| Example 81 | N-2 | 25 | Sc-2 | 9 | — | — | W-1 | 0.1 | D-1 | 300 | 3 | 5 |
| Example 82 | N-2 | 5 | Sc-2 | 9 | P-1 | 15 | W-1 | 0.1 | D-1 | 300 | 5 | 5 |
| Example 83 | N-2 | 5 | Sc-2 | 9 | P-1 | 15 | W-1 | 0.1 | D-1 | 300 | 4 | 5 |
| Example 84 | N-2 | 5 | Sc-2 | 9 | P-1 | 15 | W-1 | 0.1 | D-1 | 300 | 3 | 5 |
| Example 85 | N-2 | 5 | Sc-2 | 9 | — | — | W-1 | 0.1 | D-1 | 300 | 3 | 5 |
| Example 86 | N-2 | 5 | Sc-2 | 9 | — | — | W-1 | 0.1 | D-1 | 300 | 5 | 5 |
| Example 87 | N-2 | 5 | Sc-2 | 9 | — | — | W-1 | 0.1 | D-1 | 300 | 5 | 5 |
| Example 88 | N-1 | 5 | Sc-2 | 9 | — | — | W-1 | 0.1 | D-1 | 300 | 5 | 5 |
| Example 89 | N-3 | 5 | Sc-2 | 9 | — | — | W-1 | 0.1 | D-1 | 300 | 5 | 5 |
| Example 90 | N-4 | 5 | 5C-2 | 9 | — | — | W-1 | 0.1 | D-1 | 300 | 5 | 5 |
| Example 91 | N-2 | 5 | Sc-2 | 9 | — | — | W-1 | 0.1 | D-1 | 300 | 5 | 5 |
| Example 92 | N-2 | 5 | Sc-2 | 9 | — | — | W-1 | 0.1 | D-1 | 300 | 5 | 5 |
| Example 93 | N-2 | 5 | Sc-2 | 9 | — | — | W-1 | 0.1 | D-1 | 300 | 5 | 5 |
| Example 94 | N-2 | 5 | Sc-2 | 9 | — | — | W-1 | 0.1 | D-1 | 300 | 5 | 5 |
| Example 95 | N-2 | 5 | Sc-2 | 9 | — | — | W-1 | 0.1 | D-1 | 300 | 3 | 5 |
| Example 96 | N-2 | 5 | Sc-2 | 9 | — | — | W-1 | 0.1 | D-1 | 300 | 4 | 5 |
| Example 97 | N-2 | 5 | — | — | — | — | W-1 | 0.1 | D-1 | 300 | 5 | 5 |
| Example 98 | N-2 | 10 | — | — | — | — | W-1 | 0.1 | D-1 | 300 | 5 | 5 |
| Example 99 | N-2 | 5 | — | — | P-1 | 15 | W-1 | 0.1 | D-1 | 300 | 5 | 5 |
| Example 100 | N-2 | 5 | — | — | P-1 | 15 | W-1 | 0.1 | D-1 | 300 | 4 | 5 |
| Comparative Example 1 | N-2 | 5 | Sc-2 | 9 | — | — | W-1 | 0.1 | D-1 | 300 | 1 | 5 |
| Comparative Example 2 | N-2 | 5 | Sc-2 | 9 | — | — | W-1 | 0.1 | D-1 | 300 | 1 | 5 |
| Comparative Example 3 | N-2 | 5 | Sc-2 | 9 | — | — | W-1 | 0.1 | D-1 | 300 | 1 | 5 |
| Comparative Example 4 | — | — | Sc-2 | 9 | — | — | W-1 | 0.1 | D-1 | 300 | 5 | 1 |
| Comparative Example 5 | — | — | Sc-2 | 9 | — | — | W-1 | 0.1 | D-1 | 300 | 1 | 1 |
| Comparative Example 6 | — | — | Sc-2 | 9 | — | — | W-1 | 0.1 | D-1 | 300 | 1 | 1 |
| Comparative Example 7 | N-2 | 5 | Sc-2 | 9 | — | — | W-1 | 0.1 | D-1 | 300 | 5 | 2 |

TABLE 3-continued

| | | | | | | | | | | | | |
|---|---|---|---|---|---|---|---|---|---|---|---|---|
| Comparative Example 8 | N-2 | 5 | Sc-2 | 9 | — | — | W-1 | 0.1 | D-1 | 300 | 5 | 2 |
| Comparative Example 9 | Composition A | | | | | | | | | | 1 | 1 |
| Comparative Example 10 | Composition formed by adding 0.2% of phenothiazine to Composition A | | | | | | | | | | 3 | 1 |

As clearly shown from Tables 1 to 3, the photosensitive composition of the present invention has high artificial sweat resistance even when the photosensitive composition was cured at a low temperature.

<Preparation of Display Device>

In the display device shown in FIG. 4, each photosensitive composition obtained from the respective Examples of the present invention was used as a touch detection electrode protective film (insulation film, 420) and display devices were prepared respectively. Specifically, the protective film (420) was formed by applying each photosensitive composition obtained from the respective Examples of the present invention by spin coating, pre-baking the composition at 90° C. for 120 seconds, irradiating the film with light using a high pressure mercury lamp at an intensity of 500 mJ/cm$^2$ (in terms of i-ray), and further baking the film in an oven at 120° C. for 60 minutes. Other portions of the display device were prepared according to the production method shown in FIG. 19 of JP2013-168125A. The prepared display device had both excellent display performance and touch detection performance.

EXPLANATION OF REFERENCES

1: thin film transistor (TFT), 2: wiring, 3: insulation film, 4: flattened film, 5: first electrode, 6: glass substrate, 7: contact hole, 8: insulation film, 10: liquid crystal display device, 12: backlight unit, 14, 15: glass substrate, 16: TFT, 17: cured film, 18: contact hole, 19: ITO transparent electrode, 20: liquid crystal, 22: color filter, 110: pixel substrate, 111: polarizing plate, 112: transparent substrate, 113: common electrode, 114: insulating layer, 115: pixel electrode, 116: alignment layer, 120: counter substrate, 121: alignment layer, 122: color filter, 123: transparent substrate, 124: phase difference film, 125: sensor detection electrode, 126: adhesive layer, 127: polarizing plate, 130: sensor portion, 140: liquid crystal layer, 200: lower display panel, 210: first insulating substrate, 220: gate electrode, 240: gate insulation film, 250: semiconductor layer, 260, 262: ohmic contact layer, 270: source electrode, 272: drain electrode, 280: insulation film, 282: contact hole, 290: pixel electrode, 300: upper display panel, 310: second insulating substrate, 320: light blocking member, 330: color filter, 350: alignment layer, 370: common electrode, 400: liquid crystal layer, 410: sensing electrode, 420: insulation film, 430: driving film, 440: TFT

What is claimed is:

1. A photosensitive composition comprising:
a polymerizable monomer having three or more (meth) acryloyl groups and one or more carboxy groups in a molecule as Component A;
a polymerizable monomer having three or more (meth) acryloyl groups and not having a carboxy group in a molecule as Component B;
a photopolymerization initiator as Component C;
a solvent as Component D;
a blocked isocyanate compound as Component N; and
a polymerization inhibitor as Component K,
wherein a content of Component A is 10% to 50% by mass with respect to a total content of Component A and Component B, and
wherein Component A has a molecular weight of 10,000 or less.

2. The photosensitive composition according to claim 1, wherein a content of Component N is 0.1% to 20% by mass with respect to a total solid content of the photosensitive composition.

3. The photosensitive composition according to claim 1, wherein the content of Component A is 10% to 30% by mass with respect to the total content of Component A and Component B.

4. The photosensitive composition according to claim 1, further comprising:
an alkoxysilane compound as Component S.

5. The photosensitive composition according to claim 1, further comprising:
inorganic particles as Component E.

6. The photosensitive composition according to claim 5, wherein a content of Component E is 10% to 40% by mass with respect to a total solid content of the photosensitive composition.

7. The photosensitive composition according to claim 1, wherein the total content of Component A and Component B is 30% to 99% by mass with respect to a total organic solid content of the photosensitive composition.

8. The photosensitive composition according to claim 1, wherein a content of the polymer components is 10% by mass or less with respect to the total solid content of the photosensitive composition.

9. A method for producing a cured film comprising at least Steps 1 to 5 in this order:
Step 1: an application step of applying the photosensitive composition according to claim 1 to a substrate;
Step 2: a solvent removing step of removing a solvent from the applied photosensitive composition;
Step 3: an exposure step of exposing at least a part of the photosensitive composition from which a solvent is removed to actinic rays;
Step 4: a development step of developing the exposed photosensitive composition with an aqueous developer; and
Step 5: a heat treatment step of carrying out a heat treatment on the developed photosensitive composition.

10. The method for producing a cured film according to claim 9,
wherein the temperature of the heat treatment in Step 5 is 80° C. to 180° C.

11. A cured film that is formed by curing the photosensitive composition according to claim 1.

12. A touch panel comprising:
the cured film according to claim 11.

13. A liquid crystal display device comprising:
the cured film according to claim 11.

14. An organic EL display device comprising:
the cured film according to claim 11.

* * * * *